US006188219B1

(12) United States Patent
Reeder et al.

(10) Patent No.: US 6,188,219 B1
(45) Date of Patent: Feb. 13, 2001

(54) MAGNETIC RESONANCE IMAGING METHOD AND APPARATUS AND METHOD OF CALIBRATING THE SAME

(75) Inventors: Scott B. Reeder, Baltimore; Ergin Atalar, Columbia; Anthony Z. Faranesh, Baltimore; Elliot R. McVeigh, Timonium, all of MD (US)

(73) Assignee: The Johns Hopkins University, Baltimore, MD (US)

( * ) Notice: Under 35 U.S.C. 154(b), the term of this patent shall be extended for 0 days.

(21) Appl. No.: 09/236,054

(22) Filed: Jan. 22, 1999

(51) Int. Cl.$^7$ ....................................................... G01V 3/00
(52) U.S. Cl. .......................................... 324/307; 324/309
(58) Field of Search ..................................... 324/307, 309, 324/318, 322, 300

(56) References Cited

U.S. PATENT DOCUMENTS

| 5,168,228 | 12/1992 | Mansfield et al. ................. 324/309 |
| 5,287,854 | 2/1994 | Leunbach ........................ 128/653.2 |
| 5,336,999 | 8/1994 | Mansfield et al. ................. 324/309 |

OTHER PUBLICATIONS

P. Mansfield, Multi–planar image formation using NMR spin–echoes, *Journal Physics C*, vol. 10, pp. 55–58, 1977.
K. Kwong, Functional magnetic resonance imaging with echo planar imaging, *Magnetic Resonance Quarterly*, vol. 11, pp. 1–20, 1995.
R. Turner et al., Single–shot diffusion imaging at 2.0 Tesla, *Journal of Magnetic Resonance*, vol. 86, pp. 445–452, 1990.
M. Moseley et al., Ultrafast magnetic resonance imaging: diffusion and perfusion, *Canadian Association of Radiologists Journal*, vol. 42(1), pp. 31–38, 1991.
M. Stehling et al., Echo–planar imaging: magnetic resonance imaging in a fraction of a second, *Science*, vol. 254, pp. 43–50, 1991.

K. Butts et al., Echo–planar imaging of the liver with a standard MR imaging system, *Radiology*, vol. 189(1), pp. 259–264, 1993.
G. McKinnon, Ultrafast interleaved gradient–echo–planar imaging on a standard scanner, *Magnetic Resonance in Medicine*, vol. 30(5), pp. 609–616, 1993.
K. Oshio et al., GRASE (gradient–and spin–echo) imaging; a novel fast MRI technique, *Magnetic Resonance in Medicine*, vol. 20(2), pp. 344–349, 1991.
A. Oppenheim et al., *Discrete–Time Signal Processing*, pp. 250–252, 313, and 314, 1989.

(List continued on next page.)

*Primary Examiner*—Jay Patidar
*Assistant Examiner*—Brij B. Shrivastav
(74) *Attorney, Agent, or Firm*—Kirk D. Houser; Arnold B. Silverman; Eckert Seamans Cherin & Mellott, LLC

(57) ABSTRACT

The invention provides a method of magnetic resonance imaging. A magnetic resonance imaging apparatus having a plurality of gradient axes is employed. A plurality of imaging planes are employed with respect to the gradient axes. A plurality of gradient referencing pre-scans are executed for the imaging planes to provide a plurality of calibration correction values for the imaging planes. A specimen is employed with respect to the gradient axes. An imaging plane is selected with respect to the specimen, and a main magnetic field is established with respect to the specimen. Radio frequency pulses are applied to the specimen to produce magnetic resonance signals. The calibration correction values for the selected imaging plane are employed to adjust a plurality of gradient waveforms. The gradient waveforms are output as a plurality of magnetic field gradients with respect to the gradient axes. Magnetic resonance information is acquired from the magnetic resonance signals corresponding to the radio frequency pulses. The magnetic resonance information is employed to display an image of the specimen. Associated apparatus and calibration method are also disclosed.

52 Claims, 12 Drawing Sheets

OTHER PUBLICATIONS

H. Bruder et al., Image reconstruction for echo planar imaging with nonequidistant k-space sampling, *Magnetic Resonance in Medicine,* vol. 23, pp. 311–323, 1992.

A. Jesmanowicz et al., Phase correction for EPI using internal reference lines, *12th Annual Meeting of SMRM, Book of Abstracts,* p. 1239, 1993.

S. Reeder et al., In vivo measurement of $T^*_2$ and a field inhomogeneity mass in the human heart at 1.5 T, *Magnetic Resonance in Medicine,* vol. 39, pp. 988–998, 1998.

X. Zhou et al., Reduction of a new nyquist ghost in oblique echo planar imaging, In *Fourth Annual Meeting of ISMRM,* p. 1477, 1996.

C. Ahn et al., Analysis of eddy currents in nuclear magnetic resonance imaging, *Magnetic Resonance in Medicine,* vol. 17, pp. 149–163, 1991.

S. Reeder et al., Quantification and reduction of ghosting artifacts in interleaved echo–planar imaging, *Magnetic Resonance in Medicine,* vol. 38, pp. 429–439, 1997.

E. Atalar et al., Minimization of dead–periods in MRI pulse sequences for imaging oblique planes, *Magnetic Resonance in Medicine,* vol. 32, p 773–777, 1994.

M. Bernstein et al., Angle–dependent utilization of gradient hardware for oblique MR imaging, *Journal of Magnetic Resonance Imaging,* vol. 4(1), pp. 105–108, 1994.

X. Wan et al., Reduction of geometric distortion and intensity distortions in echo–planar imaging using a multireference scan, *Magnetic Resonance in Medicine,* vol. 37(6), pp. 932–942, 1997.

D.J. Bryant et al., Measurement of flow with NMR imaging using a gradient pulse and phase difference technique, *J. Comput. Assist. Tomogr.,* vol. 8, pp. 588–593, 1984.

C.H. Meyer et al., Simultaneous Spatial and Spectral Selective Excitation, *Magnetic Resonance in Medicine,* vol. 15, pp. 287–304, 1990.

D.A. Feinberg et al., Phase Errors in Multi–Shot Echo Planar Imaging, *Magnetic Resonance in Medicine,* vol. 32, pp. 535–539, 1994.

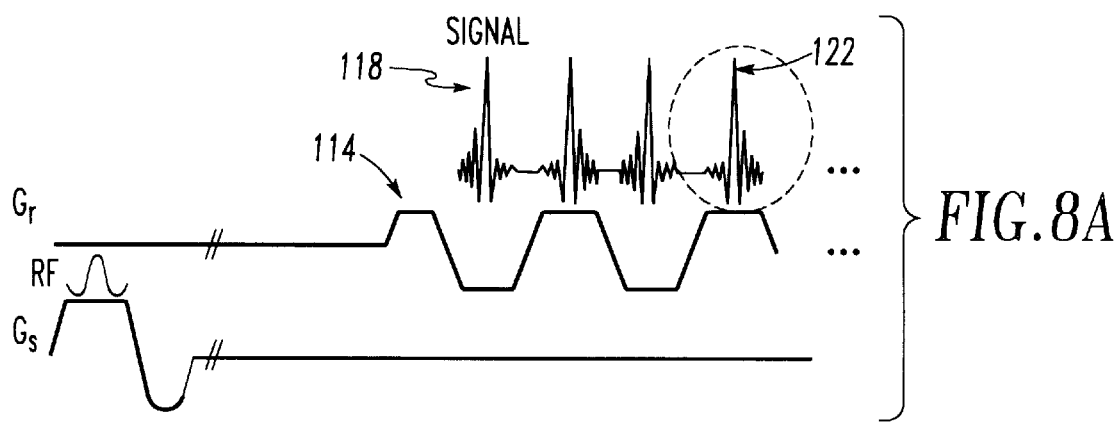
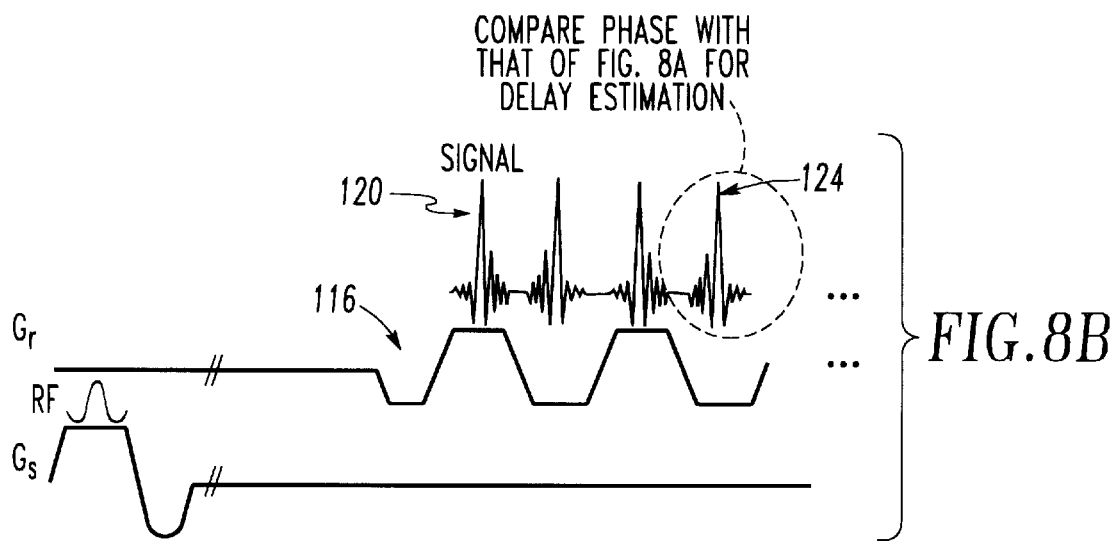

MAGNETIC RESONANCE IMAGING METHOD AND APPARATUS AND METHOD OF CALIBRATING THE SAME

This invention was made with government support under Grant #: HL45683 awarded by the National Institutes of Health. The government has certain rights in the invention.

BACKGROUND OF THE INVENTION

1. Field of the Invention

The present invention relates to an improved method for magnetic resonance (MR) applications, such as imaging, employing spatially localized magnetic field gradients and, more specifically, it relates to a method for reducing artifacts in an MR image acquired by employing a multi-polar readout scan technique such as echo planar imaging (EPI) and, most specifically, it is particularly advantageous in reducing ghost artifacts in an echo planar image. The invention also relates to an improved MR imaging apparatus employing spatially localized magnetic field gradients and, more specifically, it relates to such an apparatus for reducing artifacts in an MR image acquired by employing a technique such as EPI.

2. Description of the Prior Art

As is known to those of skill in the magnetic resonance imaging art, the gradient pulse sequence for an echo planar imaging (EPI) scan comprises a train of gradient pulses of continually alternating polarity in the readout direction, and a train of brief accompanying pulses or "blips" in the phase encoding direction. The EPI scan produces a corresponding train or series of gradient echoes comprising successive MR signals. The echoes are usefully designated as being "negative" or "positive" according to their respective positions in the echo train, since negative and positive echoes respectively correspond to readout gradients of negative and positive polarities.

Interleaved EPI is an ultra-fast imaging technique important for applications that desire high time resolution or short total acquisition times. EPI offers high speed for rapid imaging applications, especially those needing either high temporal resolution or short total acquisition times. See P. Mansfield, Multi-planar image formation using NMR spin-echoes, *Journal Physics C*, vol. 10, pp. 55–58, 1977; and U.S. Pat. Nos. 5,168,228; 5,287,854; 5,336,999; and 5,672,969.

A wide variety of applications take advantage of the speed performance of EPI, such as: (1) functional imaging, see K. Kwong, Functional magnetic resonance imaging with echo planar imaging, Magnetic Resonance Quarterly, vol. 11, pp. 1–20, 1995; (2) diffusion weighted imaging, see, R. Turner et al., Single-shot diffusion imaging at 2.0 Tesla, *Journal of Magnetic Resonance*, vol. 86, pp. 445–52, 1990; (3) perfusion imaging, see, M. Moseley et al., Ultrafast magnetic resonance imaging: diffusion and perfusion, *Canadian Association of Radiologists Journal*, vol. 42(1), pp. 31–38, 1991, and M. Stehling et al., Echo-planar imaging: magnetic resonance imaging in a fraction of a second, *Science*, vol. 254, pp. 43–50, 1991; and (4) interleaved EPI of various organs of the body, see, K. Butts et al., Echo-planar imaging of the liver with a standard MR imaging system, Radiology, vol. 189(1), pp.259–64, 1993 (liver), and G. McKinnon, Ultrafast interleaved gradient-echo-planar imaging on a standard scanner, *Magnetic Resonance in Medicine*, vol. 30(5), pp. 609–16, 1992 (heart).

An entire image can typically be acquired in times ranging from 50–200 ms.

Unfortunately, EPI is prone to significant ghosting artifacts, resulting primarily from system time delays that cause data matrix misregistration. In typical applications, system time delays are orientation dependent, resulting from anisotropic physical gradient delays. The behavior of time delays is characterized in oblique coordinates and the ghosting artifacts are caused by anisotropic delays.

Misregistrations of raw k-space data (i.e., $k_r$, readout direction; $k_p$, phase encoding direction; and $k_s$, slice direction) caused by system time delays and phase offsets are a significant problem for sequences such as EPI and gradient and spin-echo (GRASE), see, K. Oshio et al., GRASE (gradient- and spin-echo) imaging: a novel fast MRI technique, *Magnetic Resonance in Medicine*, vol. 20(2), pp. 344–49, 1991, where lines of k-space are acquired in two directions.

System filters have causal impulse responses which manifest as k-space misregistrations. See, A. Oppenheim et al., *Discrete Time Signal Processing*, pp. 250–52, 313, and 314, 1982; and H. Bruder et al., Image reconstruction for echo planar imaging with non-equidistant k-space sampling, *Magnetic Resonance in Medicine*, vol. 23, pp. 311–23, 1992.

Gradient hardware also contributes to system delays, as do demodulations, RF coils, and other sources that are patient independent.

"Reference scans" are often used to measure time delays and phase offsets as part of the imaging protocol. See, H. Bruder et al., Image reconstruction for echo planar imaging with non-equidistant k-space sampling; A. Jesmanowicz et al., Phase correction for EPI using internal reference lines, *12th Annual Meeting of SMRM, Book of Abstracts*, p. 1239, 1993. However, reference scans can add significant time to a magnetic resonance (MR) examination, especially if the prescription or imaging plane is changing orientation and time delays are orientation dependent. This increases the total examination time and defeats the primary advantage of EPI, namely, speed. Furthermore, repeated reference scanning is not feasible with EPI based real-time MR systems, because scan planes are continually changing.

Anisotropic delays cause a ghosting artifact resulting from alternating k-space shifts in the phase encoding direction. These shifts in k-space caused by anisotropic delays bias time delay measurements made with reference scans in oblique coordinates. For this reason, EPI techniques that rely on reference scan measurements preferably avoid these measurements in oblique coordinates.

Cardiac imaging, in particular, poses several challenges for EPI. First, the field inhomogeneities present in the vicinity of the heart are accentuated by the heart's proximity to the lungs in the mediastinum, as well as susceptibility effects from large veins carrying deoxygenated blood. See, S. Reeder et al., In vivo measurement of $T*_2$ in human hearts at 1.5 T: implications for cardiac echo planar imaging, *Magnetic Resonance in Medicine*, vol. 39, pp. 988–98, 1997.

In addition, ventricular motion and ventricular blood flow can cause significant phase shifts in the imaging signal. The geometry of the thorax itself can change between breathholds, which may also present problems for EPI reference algorithms that are object dependent.

Once time delay estimates are made, post-processing algorithms are often used to correct for these delays. These algorithms require additional computational expense.

Many EPI systems rely upon post-processing routines to correct for time delays and constant phase offsets. This is usually done by applying the principles of the Fourier shift theorem. After Fourier transformation in the readout direction, each profile is multiplied by the appropriate phase roll and constant phase offset, before Fourier transformation in the phase encoding direction. While such post-processing algorithms can be effective and accurate only when the gradient waveform delays are isotropic, a more attractive and computationally less expensive approach is to modify the gradient waveform to produce data that does not require correction even with anisotropic gradient waveform delays.

It is known, for a single oblique non-orthogonal scan plane orientation, to employ amplitude correction values for only the phase encoding gradient waveform to, thus, avoid use of post-processing algorithms to make k-space misregistration corrections in only the phase encoding direction. See, X. Zhou et al., Reduction of a new nyquist ghost in oblique echo planar imaging, In *Fourth Annual Meeting of ISMRM,* p. 1477, 1996; U.S. Pat. No. 5,672,969. In this manner, the sampled data is free from misregistrations in only the phase encoding direction.

Gradient hardware systems are the only orientation dependent source of system hardware delays. These delays can result from eddy currents, see, C. Ahn et al., Analysis of eddy currents in nuclear magnetic resonance imaging, *Magnetic Resonance in Medicine,* vol. 17, pp. 149–63, 1991, as well as sequencer errors that delay the intended waveform. Regardless of their source, these delays can be modeled as a time shift of the entire gradient waveform.

The incremental delay is independent of slice orientation when the delay from each of the different gradient amplifiers is the same. If these delays are different, however, the effective delay becomes image orientation dependent. Such anisotropy has serious implications for echo planar image reconstruction, especially for real-time EPI systems that rapidly change image orientation and require rapid image reconstruction and delay compensation, without repeated reference scans.

Time shifts of gradient waveforms can only correct anisotropic delays to the precision of the gradient waveform sequencers. For example, if the sequencer precision is 4 $\mu$s, then delay corrections can only be made to the nearest 2 $\mu$s. At a bandwidth of ±62.5 kHz, this represents a 0.25 sample shift, which can cause considerable ghosting. See, S. Reeder et al., Quantification and reduction of ghosting artifacts in interleaved echo planar imaging, *Magnetic Resonance in Medicine,* vol. 38, pp. 429–39, 1997.

Once time delay calibration of a scanner has been performed, there are several steps that can be taken to correct for the system hardware delays. The easiest way to correct for orientation independent delays from within the pulse sequence is to delay the sampling period to better align echoes in the readout direction of k-space. As well, anisotropic gradient delays can be compensated by shifting entire physical gradient waveforms by $-t_x$, $-t_y$, and $-t_z$, for the x, y and z physical gradients. This latter correction is only possible, however, in pulse sequences that calculate and play physical waveforms, and do not rely upon oblique rotation boards. In any case, simple shifts of the gradient waveforms and sampling periods can only correct delays to the precision of the gradient waveform sequencers.

For these reasons, there remains a very real and substantial need for an improved apparatus and method of operation thereof for magnetic resonance imaging.

SUMMARY OF THE INVENTION

The present invention has met this need by providing an improved method of magnetic resonance imaging. This method includes employing a magnetic resonance imaging apparatus having a plurality of gradient axes, and employing a plurality of imaging planes with respect to the gradient axes. A plurality of gradient referencing pre-scans are executed for the imaging planes to provide a plurality of calibration correction values for the imaging planes. A specimen is employed with respect to the gradient axes, and an imaging plane is selected with respect to the specimen. A main magnetic field is established with respect to the specimen, and radio frequency pulses are applied to the specimen to produce magnetic resonance signals. The calibration correction values are employed for the selected imaging plane to adjust a plurality of gradient waveforms. The gradient waveforms are output as a plurality of magnetic field gradients with respect to the gradient axes. Magnetic resonance information is acquired from the magnetic resonance signals corresponding to the radio frequency pulses, and the magnetic resonance information is employed to display an image of the specimen.

A preferred refinement includes storing a predetermined count of imaging planes in a look-up table, employing the selected imaging plane with respect to the gradient axes different than the imaging planes in the look-up table, and interpolating the look-up table to provide the calibration correction values for the selected imaging plane.

Another preferred refinement includes employing readout, phase encoding and slice gradients as logical gradient waveforms; converting the logical gradient waveforms to physical gradient waveforms; and outputting the physical gradient waveforms as the magnetic field gradients. Any, and preferably all, of the logical gradient waveforms may be adjusted.

A further refinement includes storing the calibration correction values in a look-up table. Also, an azimuthal angle of a vector normal to the selected imaging plane may be employed along with a polar angle of the vector. In turn, the calibration correction values in the look-up table are accessed with the angles.

The invention further provides an improved apparatus for magnetic resonance imaging. The apparatus includes means for establishing a main magnetic field with respect to a specimen, and means for applying radio frequency pulses to the specimen to produce corresponding magnetic resonance signals. A means applies a plurality of gradient waveforms to the specimen. A means defines or stores a plurality of calibration correction values for each of a plurality of different imaging planes. A means selects an imaging plane with respect to the specimen, and a means employs the calibration correction values for the selected imaging plane to adjust at least some of the gradient waveforms. A means acquires magnetic resonance information from the magnetic resonance signals corresponding to the radio frequency pulses, and a means employs the magnetic resonance information for displaying an image of the specimen.

Preferably, the means employing the calibration correction values further includes means employing at least one of: gradient time shift, and sampling comb time shift in combination with the means for applying gradient blips to adjust the gradient waveforms for the selected imaging plane. Also, the means employing the calibration correction values may include means for adjusting all of the gradient waveforms.

The invention also provides an improved method for calibrating a magnetic resonance imaging apparatus. A plurality of imaging planes are employed with respect to plural gradient axes, and at least some of the imaging planes are employed at oblique angles with respect to the gradient axes. A plurality of gradient referencing pre-scans are executed for the imaging planes to provide a plurality of calibration correction values for the imaging planes. The calibration correction values are stored for the imaging planes to calibrate the magnetic resonance imaging apparatus.

It is an object of the present invention to provide a method and apparatus for providing MR imaging of the interior of specimens, including rapid in vivo and in vitro imaging of patients and patient-derived specimens.

These and other objects of the invention will be more fully understood from the following detailed description of the invention on reference to the illustrations appended hereto.

BRIEF DESCRIPTION OF THE DRAWINGS

FIGS. 8A–8B are plots of two acquisitions for a balanced reference scan in accordance with the invention.

DESCRIPTION OF THE PREFERRED EMBODIMENTS

As used herein, the term "specimen" shall refer to any object placed in a main magnetic field for producing images and shall expressly include, but not be limited to, members of the animal kingdom, including humans; test specimens, such as biological tissue, for example, removed from such members of the animal kingdom; and inanimate objects or phantoms which may be imaged by magnetic resonance techniques, or which contain water or sources of other sensitive nuclei.

As used herein, the term "patient" shall mean human beings and other members of the animal kingdom.

Figure 1:
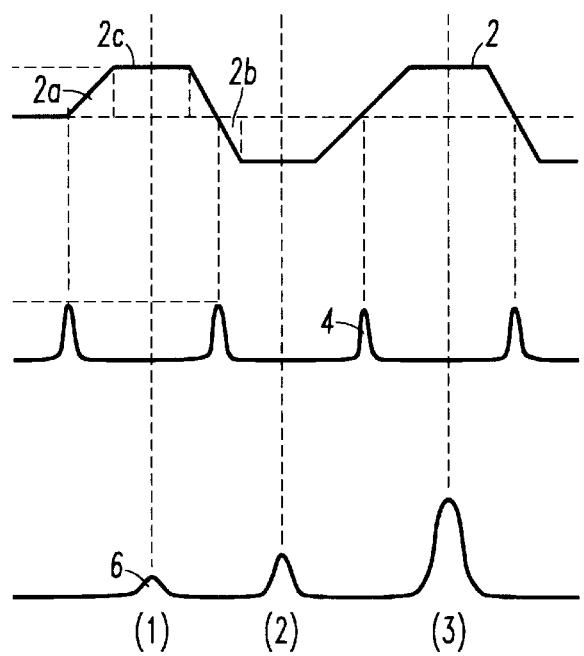
FIG. 1 is a section of a pulse sequence diagram showing a readout gradient waveform, phase encoding gradient waveform, and acquired echoes associated with an echo planar imaging (EPI) scan.
Figure 2:
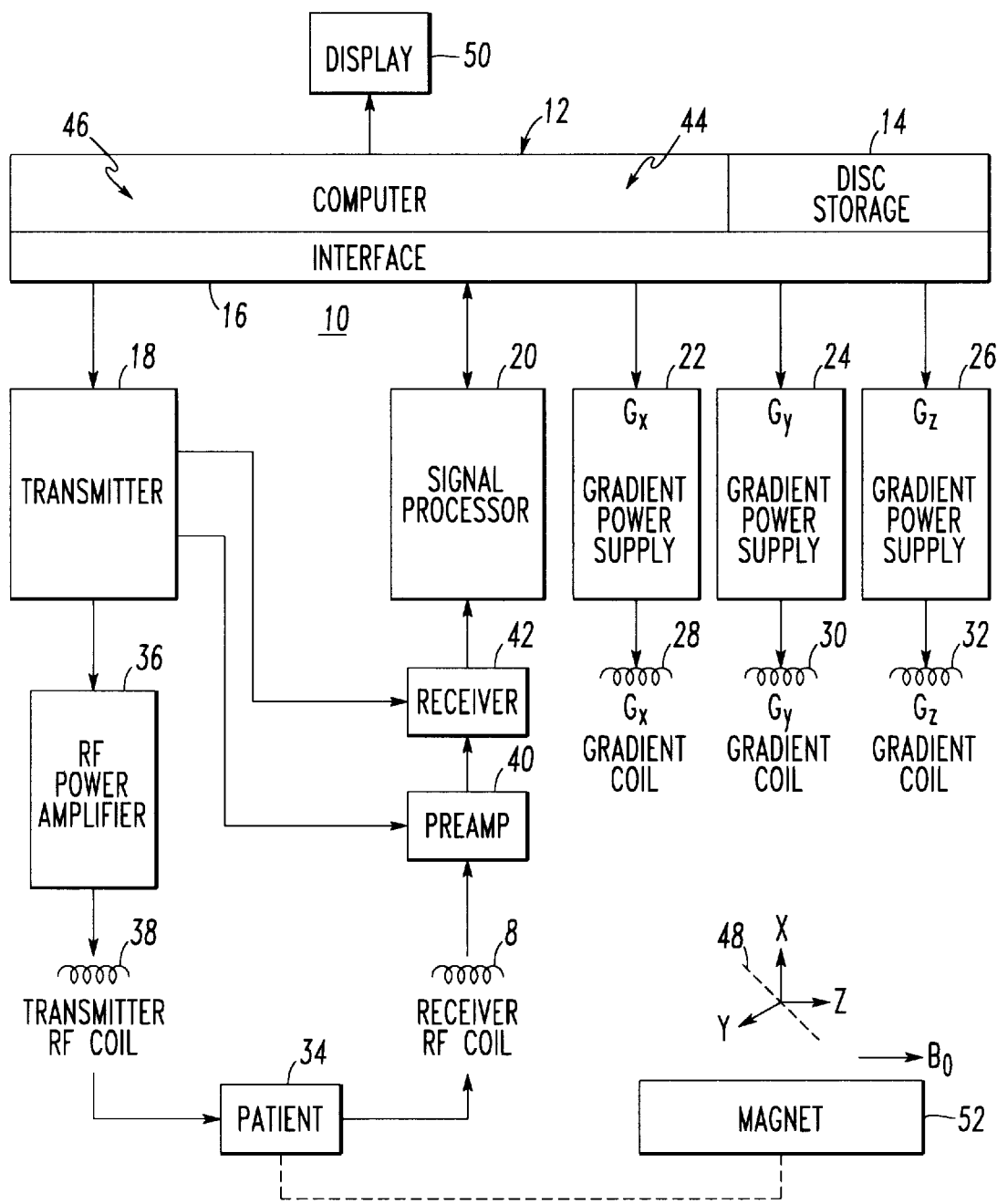
FIG. 2 is a simplified block diagram of the major components of a magnetic resonance (MR) imaging system suitable for use with the invention described herein.

Referring to FIG. 1, there are shown readout gradient pulses 2 and phase encoding gradient pulses 4 for the MR scan technique conventionally known as echo planar imaging (EPI), together with a series of echoes or MR signals 6 generated by the scan. The readout gradient pulses 2 form a generally trapezoidal shape, and alternate between pulses 2a of positive polarity and pulses 2b of negative polarity. All of the phase encoding pulses 4 within one echo train typically have the same polarity and amplitude and are of brief time duration. The peak of each echo 6, under ideal conditions, coincides in time with the center of a data acquisition window, which is located at the mid-point 2c of successive readout pulses 2a or 2b, in accordance with conventional EPI practice. An RF coil, such as coil 8 shown in FIG. 2, is operated during each data acquisition window to receive or acquire an echo 6, so that information provided thereby can be used to construct an MR image. The time spacing between the centers of adjacent data acquisition windows and, therefore, between adjacent echoes 6, is a measure of the width of successive readout pulses 2.

FIG. 1 further shows successive echoes 6 consecutively numbered as (1),(2),(3) to designate their respective positions in the echo train. Thus, all positive (or odd numbered) echoes 6 are associated with positive readout pulses such as 2a, and all negative (or even numbered) echoes 6 are associated with negative readout pulses such as 2b. Such positive-negative designation provides a very convenient mechanism for distinguishing between echoes respectively corresponding to positive and negative readout gradient pulses. In another embodiment, negative and positive echoes could respectively correspond to negative and positive readout gradients. It is common practice, in EPI single-shot scans, for the count of the echoes 6 to range from 64 to 256 echoes, although other counts are possible.

As is well known by those of skill in the art, a conventional EPI pulse sequence, in addition to the respective pulse sequences shown in FIG. 1, includes a slice selection gradient, possibly one or more RF pulses to generate the echoes 6, and additional pre-phasing gradient pulses in the readout and/or phase encoding directions.

FIG. 2 is a simplified block diagram of the major components of a magnetic resonance (MR) imaging system 10 suitable for use with the invention described herein. The system 10 includes a general purpose mini-computer 12 which is functionally coupled to a disk storage unit 14 and an interface unit 16. It will be appreciated that while reference has been made to the exemplary mini-computer 12, other processors such as, for example, microcomputers, microprocessors, personal computers, workstations or mainframe computers may be employed.

In the system 10, a radio frequency (RF) transmitter 18, signal processor 20, and gradient power supplies or amplifiers 22,24,26, are all coupled to computer 12 through interface unit 16. Gradient power supplies 22,24,26 energize gradient coils 28,30,32 to create magnetic field gradients $G_x, G_y, G_z$ in the "x","y","z" directions, respectively, over a specimen to be imaged, such as a patient 34, disposed in a static main magnetic field $B_0$. RF transmitter 18 is gated with pulse envelopes from computer 12 to generate RF pulses having the required modulation to excite an MR response signal from the specimen. The RF pulses are amplified in an RF power amplifier 36 to various levels (e.g., from about 100 watts to many kilowatts), depending on the imaging method, and applied to a transmitter coil 38. Higher power levels, for example, are employed for large specimen volumes, such as in whole body imaging, and where short duration pulses are required to excite larger MR frequency bandwidths. The specimen is generally aligned with the magnetic field $B_0$ and the RF pulses are imposed perpendicular thereto.

The MR response signal is sensed by the receiver coil 8, amplified in a low noise preamplifier 40 and passed to receiver 42 for further amplification, detection, and filtering. The signal is then digitized for averaging or other signal sampling by signal processor 20 and for subsequent processing by computer 12. Preamplifier 40 and receiver 42 are protected from the RF pulses during transmission by active gating or by passive filtering.

The computer 12 includes a pulse sequence controller 44, which is operated to control the operation of the gradient power supplies 22,24,26, and to thereby generate an EPI pulse sequence to produce and acquire successive echoes 6 of FIG. 1. The computer 12 also includes image processing sub-system 46 for processing information provided by the acquired echoes 6 to construct an image of the patient 34 taken in an imaging plane 48.

The computer 12 provides gating and envelope modulation for the RF pulses, blanking for the preamplifier 40 and RF power amplifier 36, and voltage waveforms for the gradient power supplies 22,24,26. Where oblique imaging is employed, the angle of impingement of the vector representing the spatial gradient of the magnetic field will be angularly offset from either the x, y, or z directions. This arrangement results in excitation of the nuclei within the area or volume to be imaged and causes responsive emission of magnetic energy which is picked up by preamplifier 40 and receiver 42.

The computer 12 also performs conventional data processing such as Fourier Transformation, image reconstruction, data filtering, imaging display, and storage functions. Within computer 12, the Fourier Transformations of signals convert the plot of amplitude versus time to a map of the distribution of frequencies by plotting amplitude versus frequency. The Fourier Transformations are performed in order to establish the intensity value positions of specific pixels and/or to obtain chemical shift spectra at those positions. These values may be stored, enhanced or otherwise processed, and emerge to be displayed on a suitable screen, such as a cathode-ray tube 50, for example.

Transmitter coil 38 and receiver RF coil 8, if desired, may comprise a single coil (not shown). Alternatively, two separate coils that are electrically decoupled from each other may be used. The latter configuration has the advantage of reduced RF pulse breakthrough into preamplifier 40 and receiver 42 during pulse transmission. In both cases, the transmitter and receiver coils 38,8 generate RF magnetic fields that are orthogonal to the direction of the magnetic field $B_0$ produced by a magnetic field generator such as magnet assembly 52. The magnet, patient, and all coils may be isolated from the remainder of the system 10 by enclosure in an RF shielded cage (not shown). Any suitable transmitter and receiver coils known to those skilled in the art may be employed.

The magnetic field gradient coils 28,30,32 provide gradients $G_x, G_y, G_z$, respectively, that are preferably monotonic and linear over the specimen volume. Nonlinear gradients cause geometric distortions of the image.

The magnet assembly 52 has a central cylindrical bore (not shown) which generates the magnetic field $B_0$, typically in the axial, or z Cartesian coordinate direction. A set of coils, such as the coils 28,30,32, receive electrical signals and provide at least one gradient magnetic field within the volume of the bore. Also situated within the bore is the RF coil 8 (or, alternatively, a single coil for coils 38,8), which receives RF energy to provide an RF magnetic field (not shown) typically in the x-y plane.

The exemplary patient 34 is placed within the magnet assembly 52 of the exemplary MR imaging system 10, although the invention is applicable to a wide range of MR imaging systems (e.g., MR imaging, MR spectroscopy, MR imaging under volume selective pulses, slice selection, saturation pulses, spatial-spectral pulses). A pulse sequence is then applied and the data is analyzed. Although 2-D imaging is disclosed herein, the present invention is applicable to other imaging techniques (e.g., 3-D imaging).

The positions of the gradient coils 28,30,32 in the respective x,y,z directions determines the "physical coordinate system." On the other hand, a coordinate system employing readout, phase encoding and slice directions is called the "logical coordinate system." A gradient waveform in logical coordinates is defined as $\underline{G}(t)=[G_r(t)\ G_p(t)\ G_s(t)]^T$ wherein: $G_r(t)$, $G_p(t)$, and $G_s(t)$ represent the gradient waveforms in readout, phase encoding, and slice directions, respectively; and $^T$ indicates the transpose of a vector (e.g., from a row vector to a column vector). The waveforms that are applied to each of the x, y, and z gradient amplifiers 22, 24, and 26, respectively, are calculated by a rotational transformation as: $\underline{G}'(t)=R\underline{G}(t)=[G_x(t)\ G_y(t)\ G_z(t)]^T$, wherein: R is the 3×3 rotation matrix that maps the gradient waveforms from logical to physical coordinates.

Figure 3:
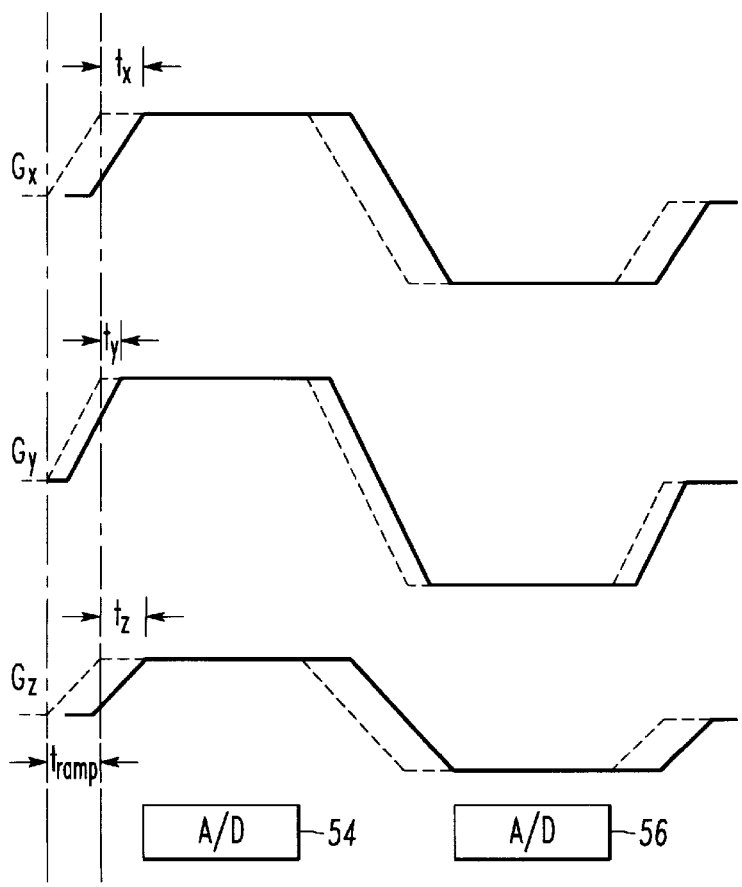
FIG. 3 is a plot of the readout gradient ($G_r(t)$) after oblique rotation played on the three physical gradient axes (x, y, and z), showing the time delays of the physical gradients ($t_x$, $t_y$, $t_z$), the gradient ramp time ($t_{ramp}$), and the sampling combs (A/D periods).

FIG. 3 shows the three physical gradients $G_x$, $G_y$, and $G_z$ of a readout gradient rotated to an arbitrary oblique orientation, such as imaging plane 48 of FIG. 2. The time delay operator (D) that delays the physical gradient waveform, $\underline{G}'(t)$, in physical coordinates, is shown in Equation 1.

$$D\{\underline{G}'\} = D\left\{\begin{bmatrix} G_x(t) \\ G_y(t) \\ G_z(t) \end{bmatrix}\right\} = \begin{bmatrix} G_x(t-t_x) \\ G_y(t-t_y) \\ G_z(t-t_z) \end{bmatrix} \quad (1)$$

wherein:

$t_x$, $t_y$, and $t_z$ are the delays for the x, y, and z gradients, respectively.

Rotating $\underline{G}'(t)$ back into logical coordinates gives $R^T D\{R \underline{G}(t)\}$. The calculation of the k-space trajectory in logical coordinates is shown in Equation 2.

$$\underline{k}(\tau) = \gamma \int_0^\tau R^T D(R[G_r(t)\ 0\ 0]^T) dt \quad (2)$$

$$= \gamma R^T \int_0^\tau D(R[G_r(t)\ 0\ 0]^T) dt$$

wherein:

$k(\tau)$ is the k-space trajectory in logical coordinates;

$\tau$ is the period of time that the gradient pulses are applied;

$\gamma$ is the gyromagnetic ratio of the nucleus; and assuming $\underline{G}(t)=[G_r(t)0\ 0]^T$, which implies that the delays ($\delta k_p$) on the phase encoding blips (e.g., the phase encoding gradient pulses 4 of FIG. 1) do not contribute to delays ($\delta k_r$) in the readout direction. This assumption is valid as long as the phase encoding blips have been completed before data acquisition begins, as shown at A/D 54 and 56 of FIG. 3.

Figure 4A:
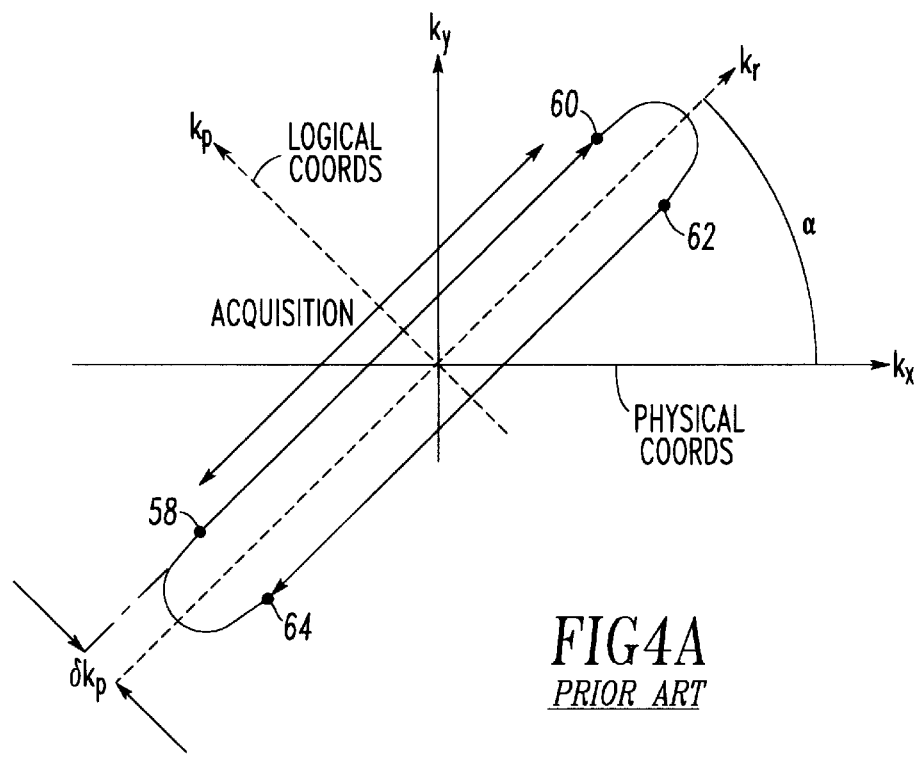
FIG. 4A is a plot of k-space trajectory after an in-plane rotation, for the physical gradient with anisotropic delays.
Figure 4B:
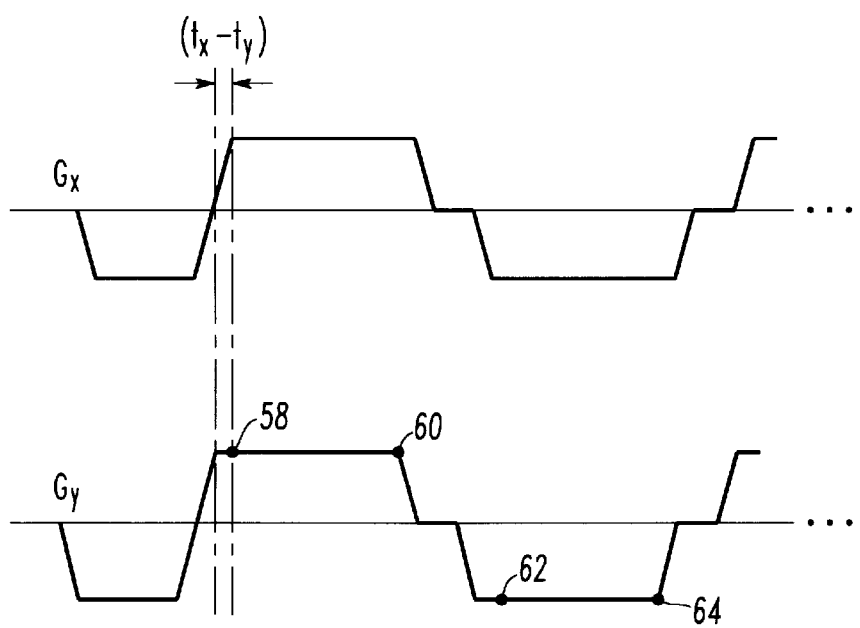
FIG. 4B is a plot of the readout gradient ($G_r(t)$) after oblique rotation played on two physical gradient axes (x, and y), showing the sampling combs (A/D) and the difference ($t_x-t_y$) in the time delays of the two physical gradients, with positions in time corresponding to the positions in k-space as shown in FIG. 4A, but not showing the shift ($\delta k_r$) in the readout direction.

In FIGS. 4A–4B, the effect of the gradient delay on the k-space trajectory is illustrated. For the trapezoid pulses, the ramp time $t_{ramp}$ (shown in FIG. 3) is $$t_{ramp} = \frac{|G_r|}{\left[\dfrac{dG_r}{dt}\right]},$$

where $$\frac{dG_r}{dt}$$

is the slew rate of the readout gradient. Expansion of Equation 2 is shown in Equation 3.

$$\underline{k}(\tau) = \gamma(\pm G_r)\begin{bmatrix} \tau - R_{11}^2\left(t_x - \dfrac{t_x^2 \dfrac{dG_r}{dt}}{2G_r}\right) & -R_{21}^2\left(t_y - \dfrac{t_y^2 \dfrac{dG_r}{dt}}{2G_r}\right) & -R_{31}^2\left(t_z - \dfrac{t_z^2 \dfrac{dG_r}{dt}}{2G_r}\right) \\ \tau - R_{12}R_{11}\left(t_x - \dfrac{t_x^2 \dfrac{dG_r}{dt}}{2G_r}\right) & -R_{22}R_{21}\left(t_y - \dfrac{t_y^2 \dfrac{dG_r}{dt}}{2G_r}\right) & -R_{32}R_{31}\left(t_z - \dfrac{t_z^2 \dfrac{dG_r}{dt}}{2G_r}\right) \\ \tau - R_{13}R_{11}\left(t_x - \dfrac{t_x^2 \dfrac{dG_r}{dt}}{2G_r}\right) & -R_{23}R_{21}\left(t_y - \dfrac{t_y^2 \dfrac{dG_r}{dt}}{2G_r}\right) & -R_{33}R_{31}\left(t_z - \dfrac{t_z^2 \dfrac{dG_r}{dt}}{2G_r}\right) \end{bmatrix} \quad (3)$$

wherein:

$R_{ij}$ is the 3×3 rotation matrix element of the $i^{th}$ row and the $j^{th}$ column;

i=1, 2 or 3;

j=1, 2 or 3;

the time delays $t_x$, $t_y$ and $t_z$ are always shorter than the ramp time, $t_{ramp}$; and oblique rotation does not change the amplitude or effective slew rate of the readout gradient, although other types of oblique optimization procedures are known. See, E. Atalar et al., Minimization of dead-periods in MR pulse sequences for imaging oblique planes, *Magnetic Resonance in Medicine,* vol. 32, pp 773–77, 1994; and M. Bernstein et al., Angle-dependent utilization of gradient hardware for oblique MR imaging, *Journal of Magnetic Resonance Imaging,* vol. 4(1), pp. 105–08, 1994.

The quadratic term $$\frac{t_i^2 \frac{dG_r}{dt}}{2G_r}$$

(i=x, y, z) in Equation 3 may be ignored $$\left\{ e.g., \text{ if } t_i = 3 \, \mu s, \, \frac{dG_r}{dt} = 120 \frac{T/m}{s}, \, G_r = 2 \frac{G}{cm}, \right.$$

then $$\left. \frac{t_i^2 \frac{dG_r}{dt}}{2G_r} = 0.027 \, \mu s \right\},$$

thus, allowing the shift in the readout direction to be defined by Equation 4.

$$\delta k_r = \pm \gamma G_r (R_{11}{}^2 t_x + R_{21}{}^2 t_y + R_{31}{}^2 t_z) \quad (4)$$

wherein:

$G_r$ is the amplitude of the readout gradient in logical coordinates.

In the case that all time delays are equal (i.e., $t_x=t_y=t_z$), then the effective shift ($\delta k_r$) in the readout direction ($k_r$, as shown in FIG. 4A) is independent of image orientation as shown by Equation 5.

$$\delta k_r = \pm \gamma G_r (R_{11}{}^2 + R_{21}{}^2 + R_{31}{}^2) t_x = \pm \gamma G_r t_x \quad (5)$$

However, if $t_x \neq t_y \neq t_z$, then the effective delay will be a weighted average of the individual delays.

The total time delay is comprised of delays from the gradients as well as those from other sources, primarily one or more low-pass filters (not shown) (e.g., an analog filter between the preamplifier 40 and receiver 42, an analog filter between the receiver 42 and signal processor 20, a digital filter of the signal processor 20 of FIG. 2). For the delay measured in the i (i=x, y or z) direction, $$t_i = t_i^{gradi} + t_{filter}$$

wherein:

$t_i$ is the total delay measured in the i direction;

$t_i^{gradi}$ is the delay contribution from the gradient; and $t_{filter}$ is the delay contribution from the analog low-pass filter.

Employing $t_i$ in Equation 4, Equation 6 shows that it is not necessary to separate the orientation dependent and independent components from one another.

$$\delta k_r = \pm \gamma G_r (R_{11}^2 t_x^{gradi} + R_{21}^2 t_y^{gradi} + R_{31}^2 t_z^{gradi} + t_{filter}) \quad (6)$$

Figure 5A:
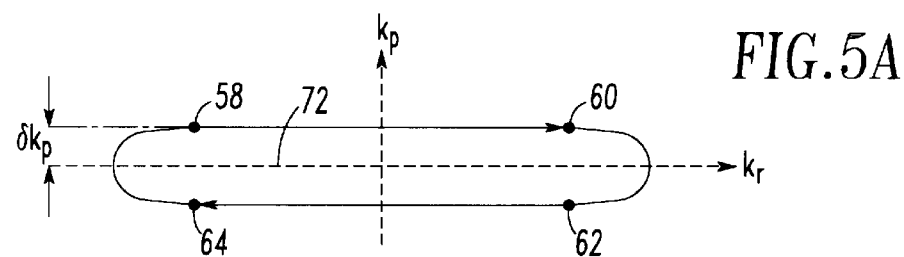
FIG. 5A is a plot of logical k-space trajectory for two echoes corresponding to the sampling combs (A/D) without phase encoding direction compensations blips (i.e., phase encoding blips off).
Figure 7A:
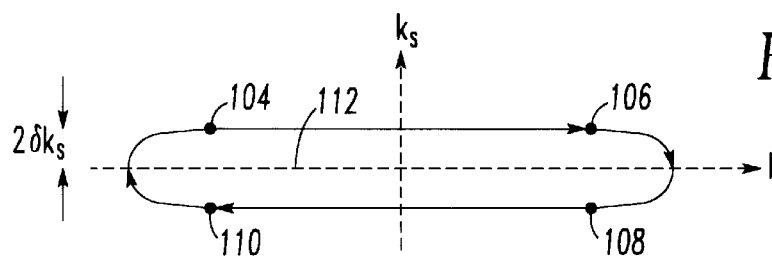
FIG. 7A is a plot of logical k-space trajectory for two echoes without slice direction compensation blips (i.e., phase encoding blips off).

As seen from Equation 3, there are also effective shifts $\delta k_p$ (as shown in FIGS. 4A and 5A) and $\delta k_s$ (as shown in FIG. 7A) in the $k_p$ and $k_s$ directions as shown in Equations 7 and 8, respectively.

$$\delta k_p = \gamma(\pm G_r)(R_{12}R_{11}t_x + R_{22}R_{21}t_y + R_{32}R_{31}t_z) \quad (7)$$

$$\delta k_s = \gamma(\pm G_r)(R_{13}R_{11}t_x + R_{23}R_{21}t_y + R_{33}R_{31}t_z) \quad (8)$$

The shift ($\delta k_p$) in the phase encoding direction adds/subtracts additional phase encoding to positive/negative echoes. This alternating shift in the phase encoding direction can cause ghosting artifacts. See, X. Zhou et al., Reduction of a new nyquist ghost in oblique echo planar imaging; U.S. Pat. No. 5,672,969.

There are three sources of ghosting that arise from oblique imaging with anisotropic gradient delays: (1) the effective time delay is dependent on the imaging orientation, and proper correction must be used to compensate for these delays in the readout direction; (2) the alternate encoding in the slice direction, at worst, results in an alternating phase shift which causes ghosts, see, S. Reeder et al., Quantification and reduction of ghosting artifacts in interleaved echo planar imaging; and (3) the alternating phase encoding caused by anisotropic gradient delays.

This additional effective phase encoding can also bias delay calibration measurements. If anisotropic gradient delays are present and reference scans are made in oblique coordinates, the additional phase encoding caused by these delays biases delay measurements made through reference scans. Since the additional phase encoding alternates between positive and negative echoes, the bias it creates will not be removed by any reference method. Therefore, reference scans in oblique planes should be performed after correction for time delays in oblique planes have been corrected using, for example, Equation 4. The initial correction for time delays in oblique image orientation can be made by measuring time delays in the three orthogonal axes and using, for example, Equation 4 to calculate the effective readout encoding delay ($\delta k_r$) in logical coordinates.

As another example, the shift ($\delta k_s$, as shown in FIG. 7A) in the slice direction ($k_s$) causes through slice dephasing. If the object contained within the slice is asymmetrical, and if the slice profile is asymmetrical, this dephasing manifests as alternating phase shifts that cause ghost artifacts. If the slice profile is symmetric, this dephasing only results in the loss of signal, without ghosting artifacts.

As an example of the magnitude of these shifts, consider an in-plane rotation of $\alpha$ degrees about the z axis, as shown in FIG. 4A. From Equation 4, the shift ($\delta k_r$) in the readout direction is shown in Equation 9.

$$\delta k_r = \pm \gamma G_r (t_x \cos^2 \alpha + t_y \sin^2 \alpha) \quad (9)$$

$$= \pm \gamma G_r \left( \left( \frac{t_x + t_y}{2} \right) + \left( \frac{t_x - t_y}{2} \right) \cos 2\alpha \right)$$

The alternating phase encoding shift ($\delta k_p$) is shown in Equation 10, $$\delta k_p = \pm \gamma G_r \left( \frac{t_y - t_x}{2} \right) \sin 2\alpha \quad (10)$$

and there is no additional encoding in the slice direction (i.e., $\delta k_s=0$) in this case. Equations 9 and 10 explicitly show that differences in gradient delays are responsible for the orientation dependence of k-space misregistrations.

Continuing to refer to FIG. 4A, the k-space trajectory after an in-plane rotation ($\alpha$ degrees) when $t_x > t_y$ (as shown in FIG. 4B). There is a shift ($\delta k_p$) in the phase encoding direction ($k_p$) for the first echo 58–60 even though no phase encoding pulse was played (e.g., played out, executed, output). As well, the second echo 62–64 is phase encoded in the opposite direction (i.e., by an amount $-\delta k_p$). The physical gradient waveforms $G_x(t)$ and $G_y(t)$ are shown in FIG. 4B.

In the worst case, with $\alpha=45°$, for the example of a 32 cm FOV (field of view) and ±64 kHz bandwidth, $G_r$ is $$0.92 \frac{G}{cm},$$

and $\Delta k_p$ is 0.20 cm$^{-1}$. If the differential gradient time delay ($t_x$-$t_y$) is, for example, 2 $\mu$s, then $\delta k_p$=±0.025 cm$^{-1}$, about ⅛ of $\Delta k_p$. This substantial shift causes ghost artifacts which are difficult to correct with post-processing algorithms.

Ghosting artifacts caused by time shifts in the readout direction ($k_r$) are also present, although these delays can be corrected with reference scans and post-processing delay corrections. The effective readout delay ($\delta k_r$) is orientation dependent, however, and requires new reference scan measurements as the orientation changes. Since many reference techniques are object dependent, as the reference signal is modulated by field inhomogeneities and chemical shift, these effects can be reduced through the use of balanced reference scan techniques as discussed below in connection with FIGS. 8A–8B.

While residual delay can be removed with post-processing algorithms, an alternative is to use "compensation blips" (as discussed below in connection with FIGS. 5C, 6C and 7C) to adjust, for example, the position of the echoes (i.e., 58–60 and 62–64 of FIG. 4A) in the readout direction ($k_r$). This can be done very accurately, since the area of a gradient blip (e.g., phase encoding gradient pulses 4 of FIG. 1) can be adjusted with high precision. As well, the additional encoding in the phase encoding direction ($k_p$) caused by anisotropic gradient delays is difficult to remove by post-processing. Compensation blips can also be used to compensate for k-space misregistrations in the readout ($k_r$) and the slice ($k_s$) directions, caused by gradient delay anisotropy.

Figure 5B:
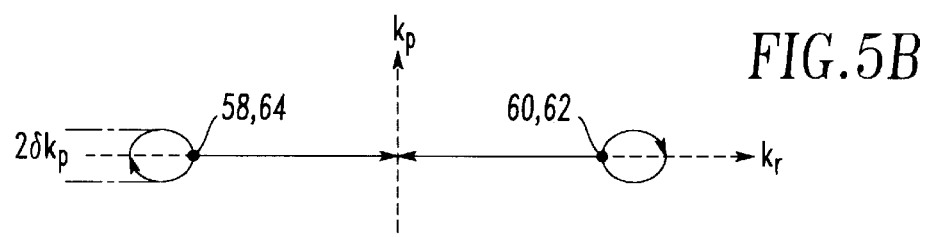
FIG. 5B is a plot of compensated k-space trajectory employing the sequence shown in FIG. 5C to remove the alternating shift ($\pm\delta k_p$) resulting from anisotropic gradient delays.
Figure 5C:
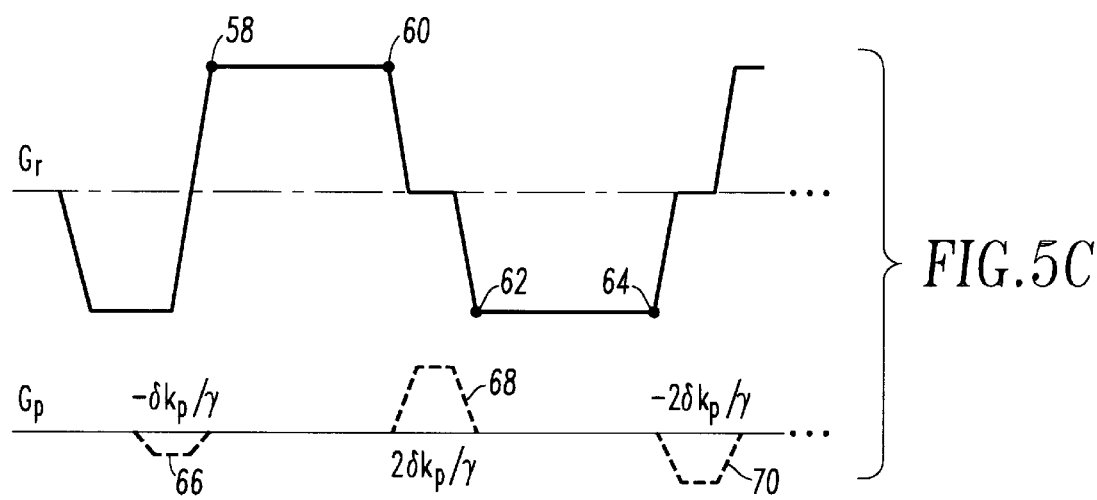
FIG. 5C is a plot of the readout gradient and the "compensation blips" for the phase encoding gradient blips in which the area under the first blip is $-\delta k_p/\gamma$ and the area under the subsequent blips is $\pm 2\delta k_p/\gamma$, with the compensation blips not being drawn to scale.

Compensation blips 66,68,70 for correction of additional phase encoding are shown in FIG. 5C. The logical k-space trajectory for two consecutive echoes (i.e., 58–60,62–64) is shown in FIG. 5A with no compensation (i.e., phase encoding off). The reference numbers 58,60,62,64 of FIGS. 5A–5B correspond to the position in k-space shown in FIG. 5C. FIG. 5B shows the compensated trajectory using the compensation blips 66,68,70 of FIG. 5C. The first compensation blip 66 has area $-\delta k_p/\gamma$ which compensates for the phase encoding delay ($\delta k_p$) from 72 to 58 of FIG. 5A. The second compensation blip 68 has area +2$\delta k_p/\gamma$ which compensates for the phase encoding delay (-2$\delta k_p$) from 58 to 62. The third compensation blip 70 has area -2$\delta k_p/\gamma$ which compensates for the next phase encoding delay (+2$\delta k_p$) from 62 to a point (not shown) like 58. In this manner, the first blip 66 has area $-\delta k_p/\gamma$, and the subsequent blips, such as 68,70, have area ±2$\delta k_p/\gamma$ for subsequent echoes. In practice, these blips are added to the standard phase encoding blips (e.g., phase encoding gradient pulses 4 of FIG. 1), which have considerably larger area than the compensation blips 66,68, 70.

Figure 5D:
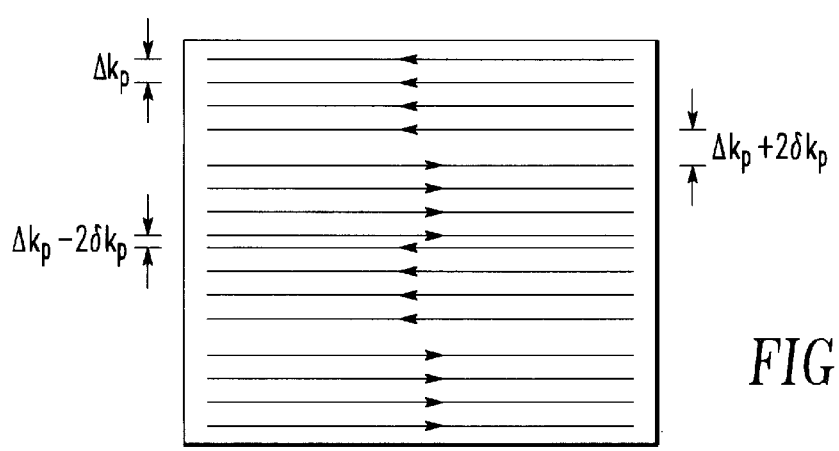
FIG. 5D is a plot of phase encoding shifts in an oblique EPI data matrix resulting from anisotropic gradient time delays in which the shift, $\pm\delta k_p$, and the separation between lines of k-space, $\Delta k_p$, are indicated.

FIG. 5D shows a plot of phase encoding shifts in an oblique EPI data matrix resulting from anisotropic gradient time delays in which the shift, ±$\delta k_p$, and the separation between lines of k-space, $\Delta k_p$, are indicated. In this exemplary embodiment, the number of interleaves, $n_i$, is four; the total number of phase encoding lines in the data matrix, $N_p$, is 16; and the arrows indicate positive echoes (i.e., arrows pointing from left to right) and negative echoes (i.e., arrows pointing from right to left).

Figure 6A:
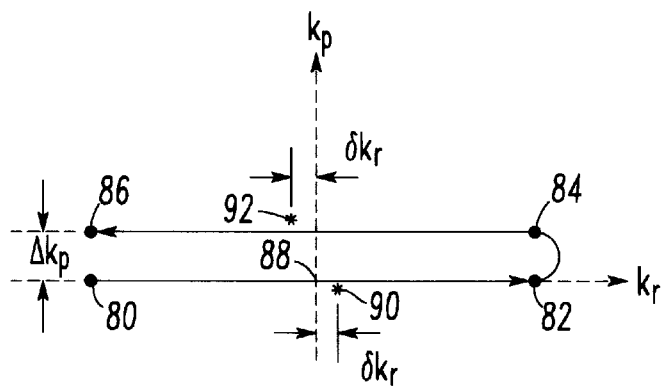
FIG. 6A is a plot of logical k-space trajectory for two echoes, positioned within the data matrix, without readout direction compensation blips, wherein misregistrations in the phase encoding direction ($\pm\delta k_p$) are ignored and a phase encoding blip (not shown) was played to advance the position in k-space by $\Delta k_p$.
Figure 6B:
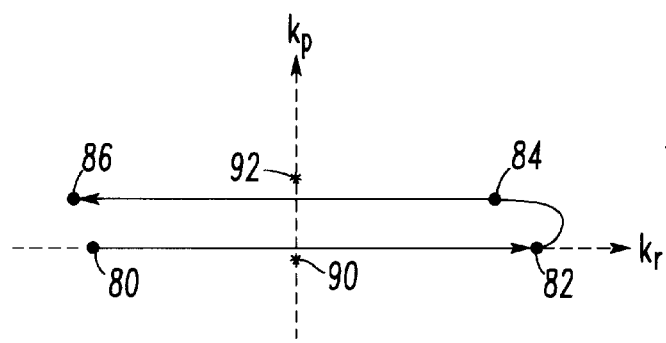
FIG. 6B is a plot of compensated k-space trajectory using the sequence shown in FIG. 6C to remove the alternating shift in the logical readout direction ($\pm\delta k_r$) resulting from anisotropic gradient delays.
Figure 6C:
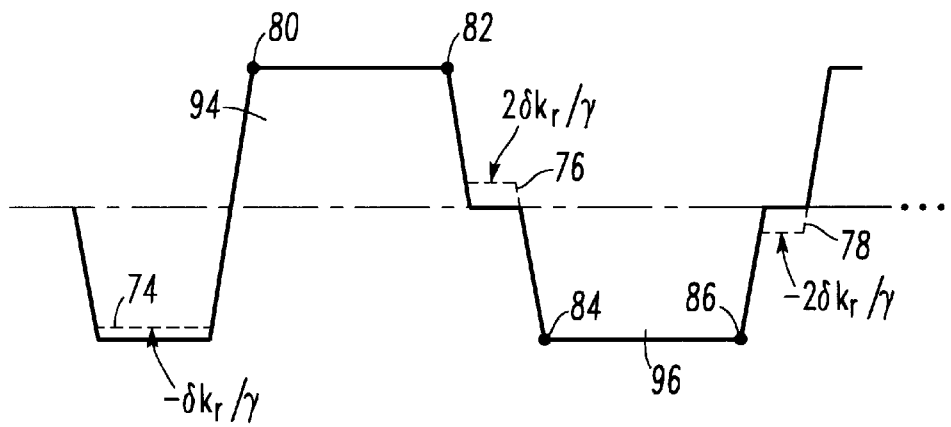
FIG. 6C is a plot of the readout gradient as compensated by readout "compensation blips" in which the area under the first blip is $-\delta k_r/\gamma$ and the area under the subsequent blips is $\pm 2\delta k_r/\gamma$, with the compensation blips not being drawn to scale.

Misregistrations in the readout direction ($k_r$) are corrected using compensation blips 74,76,78 to correct for echo shifting (e.g., for echoes 80–82 and 84–86) in the readout direction as shown in FIG. 6C. The reference numbers 80,82,84,86 of FIGS. 6A–6B correspond to the position in k-space shown in FIG. 6C. The blips 74,76,78 adjust the readout position in k-space as the readout direction sampling moves back and forth. The first compensation blip 74 has area $-\delta k_r/\gamma$ which compensates for the readout delay ($\delta k_r$) from 88 to 90 of FIG. 6A. The second compensation blip 76 has area +2$\delta k_r/\gamma$ which compensates for the readout delay (-2$\delta k_r$) from 90 to 92. The third compensation blip 78 has area -2$\delta k_r/\gamma$ which compensates for the next readout delay (+2$\delta k_r$) from 92 to a point (not shown) like 90. In this manner, the first blip 74 has area $-\delta k_r/\gamma$, and the subsequent blips, such as 76,78, have area ±2$\delta k_r/\gamma$ for subsequent echoes. This is achieved by ensuring that the area of the readout prephaser is increased by $-\delta k_r/\gamma$ (i.e., decreased by $\delta k_r/\gamma$) by blip 74, the area of the positive portion of the readout gradient at 94 is increased by +2$\delta k_r/\gamma$, and the area of the negative portion of the readout gradient at 96 is increased by -2$\delta k_r/\gamma$, as shown in FIG. 6C.

Figure 7B:
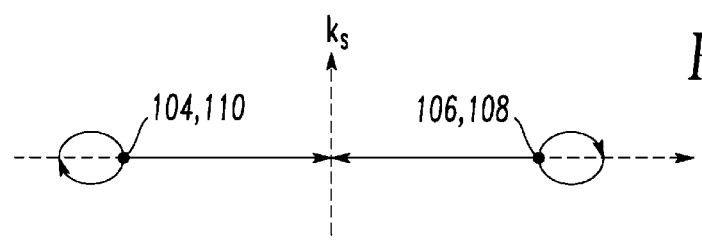
FIG. 7B is a plot of compensated k-space trajectory using the sequence shown in FIG. 7C to remove the alternating shift in the logical slice direction ($\pm\delta k_s$) resulting from anisotropic gradient delays.
Figure 7C:
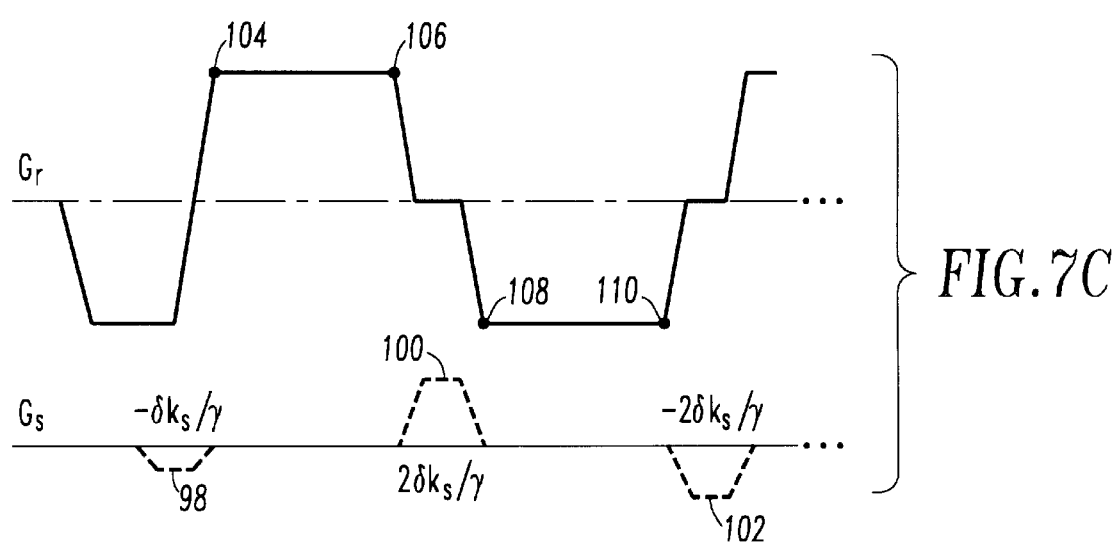
FIG. 7C is a plot of the readout gradient and the "compensation blips" for the slice gradient in which the area under the first blip is $-\delta k_s/\gamma$ and the area under the subsequent blips is $\pm 2\delta k_s/\gamma$, with the compensation blips not being drawn to scale.

As shown in FIGS. 7A–7C, compensation blips can also be introduced on the slice select axis ($k_s$) to unwind the alternating dephasing of the slice. In general, compensation blips require little to no additional time to execute, and only require knowledge of the rotation matrix, R, and the three physical gradient delays ($t_x$, $t_y$, $t_z$). Compensation blips 98,100,102 for slice direction compensation are shown in FIG. 7C. The logical k-space trajectory for two consecutive echoes (i.e., 104–106,108–110) is shown in FIG. 7A with no compensation (i.e., phase encoding off). The reference numbers 104,106,108,110 of FIGS. 7A–7B correspond to the position in k-space shown in FIG. 7C. FIG. 7B shows the compensated trajectory using the compensation blips 98,100,102 of FIG. 7C. The first compensation blip 98 has area $-\delta k_s/\gamma$ which compensates for the slice delay ($\delta k_s$) from 112 to 104 of FIG. 7A. The second compensation blip 100 has area +2$\delta k_s/\gamma$ which compensates for the slice delay (-2$\delta k_s$) from 104 to 108. The third compensation blip 102 has area -2$\delta k_s/\gamma$ which compensates for the next slice delay (+2$\delta k_s$) from 108 to a point (not shown) like 104. In this manner, the first blip 98 has area $-\delta k_s/\gamma$, and the subsequent blips, such as 100,102, have area ±2$\delta k_s/\gamma$ for subsequent echoes.

Although the initial compensation blips 66 of FIG. 5C, 74 of FIG. 6C, and 98 of FIG. 7C are preferably employed in combination with subsequent compensation blips, such as 68,70, 76,78, and 100,102, respectively, other embodiments may omit the initial compensation blips 66,74,98.

The compensation blips 66,68,70 (FIG. 5C), 74,76,78 (FIG. 6C), and 98,100,102 (FIG. 7C) are programmed in logical coordinates, allowing pulse sequences programmed in logical coordinates to make delay corrections with simple modifications to the gradient waveforms. Lastly, constant phase offsets are easily removed by adjusting the phase of the system receiver. Since this phase can be adjusted with high precision, accurate correction of constant phase offsets between positive and negative echoes is easily attained and need not rely on post-processing corrections. Preferably, calibration of a scanner is employed at one initial time, although subsequent "tune-up" calibrations may be employed to provide additional correction if needed (e.g., to correct for component aging or replacement, different operating environments).

Correction for anisotropic gradient delays through time shifts can only be made within the precision of the gradient waveforms, usually a few microseconds. Simple time shifts in the gradient waveforms cannot correct for anisotropic time delays. As well, time shifts in the gradient waveforms are difficult to implement in sequences that are programmed in logical coordinates and rely on oblique rotation boards to execute gradient waveforms in physical coordinates. Compensation blips, however, can correct for the effects of anisotropic gradient delays by compensating for orientation dependent k-space misalignments. Corrections can be made in the readout, phase encoding and slice directions, by adding the appropriate blips to the logical sequence.

Image orientation dependent k-space shifts ($\delta k_r$, $\delta k_p$, $\delta k_s$) are easily calculated with knowledge of the three delays of the physical gradients ($t_x$, $t_y$, $t_z$), and the rotation matrix R. With this information, delay corrections and encoding corrections can be made by modifying the pulse sequence itself with "compensation blips", in accordance with the invention.

Reference scans are typically employed to measure system time delays. In a reference scan, multiple lines of k-space data are acquired sequentially, with the phase encoding blips turned off ($\Delta k_y=0$). The signal for the $n^{th}$ echo of the reference scan is shown in Equation 11.

$$S_\pm(x,n) = e^{\mp j\gamma G_x(t_o x+\phi)} \int \rho(x,y) e^{\frac{j\gamma n T_{ro} \Delta\beta(x,y)}{n_i}} dy \quad (11)$$

wherein:

$$x \in \left(-\frac{FOV}{2}, \frac{FOV}{2}\right);$$

$S_\pm(x,n)$ is the Fourier transform of the $n_{th}$ line acquired in the $\pm k_x$ direction;
γ is the gyromagnetic ratio of the nucleus;
$t_o$ is the time delay of each echo;
φ is a constant phase offset;
$\rho(x,y)$ is the two-dimensional spin density of the object;
$T_{ro}$ is the time between consecutive readout trapezoids;
$\Delta\beta(x,y)$ is the local field inhomogeneity; and
$n_i$ is the number of interleaves.

Equation 11 can also be rewritten as shown in Equation 12.

$$S_\pm(x,n) = e^{\mp j\gamma G_x(t_o x+\phi)} M(x,n) e^{jA(x,n)} \quad (12)$$

wherein:
M(x,n) and A(x,n) are the magnitude and phase of the integral of Equation 11, respectively.

Standard references scans acquire one or more echo trains without phase encoding. See, for example, H. Bruder et al., Image reconstruction for echo planar imaging with non-equidistant k-space sampling; and X. Wan et al., Reduction of geometric distortion and intensity distortions in echo-planar imaging using a multireference scan, *Magnetic Resonance in Medicine*, vol. 37(6), pp. 932–44, 1997. After appropriate time reversal and 1D Fourier transformation, the phase difference of two consecutive profiles in the echo train is shown in Equation 13. See, for example, D. J. Bryant et al., Measurement of flow with NMR imaging using a gradient pulse and phase difference technique, *J. Comput. Assist. Tomogr.*, vol. 8, pp. 588–93, 1984.

$$arg(S_\pm(x,n)S_\pm^*(x,n+1)) = 2\gamma G_x(t_o x+\phi) + A(x,n) - A(x,n+1) \quad (13)$$

wherein:
arg is an operator which extracts the phase angle.
The time delay and constant offset can be estimated as shown in Equation 14.

$$t_o x + \phi = \pm \frac{1}{2\gamma G_x}(arg(S_\pm(x,n)S_\pm^*(x,n+1)) - A(x,n) + A(x,n+1)) \quad (14)$$

wherein:
* denotes complex conjugation; and
$S_\pm(x,n)$ and $S_\pm(x,n+1)$ are the $n^{th}$ and $n+1^{th}$ profiles of the reference raw data, respectively.

The additional phase from the inhomogeneities (i. e., A(x,n), A(x,n+1)) will confound attempts to measure $t_o$ and φ through linear regression, and estimates of $t_o$ and φ will be object dependent. If these values are used to correct the raw data, the bias will prevent proper delay correction.

In accordance with the invention, a "balanced" reference method is employed whereby two separate reference acquisitions are acquired. The first acquisition is the same as the standard reference, while the second acquisition is identical to the first, except that the polarity of the entire readout gradient train is reversed, as shown in FIGS. 8A–8B. In this case, the phase difference leads to an estimator where the effects of inhomogeneities have been removed as shown in Equation 15.

$$t_o x + \phi = \pm \frac{1}{2\gamma G_x} arg(S_\pm(x,n)S_\mp^*(x,n)) \quad (15)$$

wherein:
$S_\pm(x,n)$ is the $n^{th}$ profile acquired after the first excitation; and
$S_\mp^*(x,n)$ is the $n^{th}$ profile acquired after the second excitation with the readout gradient polarity reversed.

The bias is removed where the two profiles that are compared are acquired at the same time after the RF excitation. This ensures that the phase of off-resonance spins has evolved by the same amount, removing potential time delay bias. Any estimation method that satisfies this condition will not be confounded by field inhomogeneities, making it possible to provide a complete delay estimate after only two RF excitations.

As recently described by Zhou et al., Reduction of a new nyquist ghost in oblique echo planar imaging, effective time delays in the logical readout direction depend on image plane orientation. This dependence is caused by anisotropic gradient delays, where the effective time delay is a weighted average of delays along the orthogonal axes. In addition, anisotropic delays cause alternating shifts in the phase encoding direction that bias delay measurements made through reference scans. Explicitly, the $n^{th}$ profile of a reference scan in oblique coordinates is shown in Equation 16.

$$S_\pm(x,n) = e^{\mp j\gamma G_x(t_o x+\phi)} \int \rho(x,y) e^{\frac{j\gamma n T_{ro} \Delta\beta(x,y)}{n_i} \pm \delta k_y y} dy \quad (16)$$

wherein:
$\pm\delta k_y$ is the alternating phase encoding resulting from anisotropic gradient delays.

Since this additional encoding alternates between positive echoes and negative echoes, the bias it creates will be removed by neither the standard nor the balanced reference method described above. Therefore, in accordance with one embodiment of the invention, reference scans in oblique planes are preferably performed after a calibration of a scanner is implemented by measuring delays in the three orthogonal directions and initial corrections are performed using Equations 4, 7 and 8. The following algorithm outlines a methodology for calibrating a scanner using a phantom:

For each orthogonal axis (x,y,z):
(1) for both the positive readout gradient polarity (114 of FIG. 8A) and the negative readout gradient polarity (116 of FIG. 8B):
 (a) acquire echo trains 118 (FIG. 8A) and 120 (FIG. 8B), respectively, without phase encoding blips, and
 (b) Fourier transform each echo as discussed above in connection with Equations 11–15; and
(2) for each echo pair (e.g., 122 and 124 of FIGS. 8A–8B), regress the phase difference of complex profiles to estimate delays using the balanced reference method as discussed above in connection with Equations 11–15.

This algorithm employs a total of six excitations for each filter setting, a calibration procedure that is relatively simple and fast. If the contribution to the delay from different filters is known, then this component can be subtracted, reducing the total number of delay measurements to three for complete scanner delay calibration.

A primary advantage of scanner calibration is that time is not required during a patient study for reference scans. Furthermore, multiple averaging can be performed with calibration scans to ensure highly accurate estimates of time delays. This greatly reduces the ghost to noise ratio of residual ghosting caused by time delays and constant phase shifts. See, S. Reeder et al., Quantification and reduction of ghosting artifacts in interleaved echo planar imaging.

Although the scanner calibration which measures delays in the three orthogonal directions is suitably accurate (see FIG. 10), residual delays (e.g., caused by mutual inductance between gradient coils which are being simultaneously switched) are not considered. Accordingly, further improvements are possible, as discussed below in connection with FIGS. 9A–9C, where reference scans are further employed in a plurality of oblique imaging planes to obtain residual corrections.

For example, an imaging plane may be defined by a vector normal to the imaging plane wherein:

THETA is the azimuthal angle (0°–180° with respect to the z-axis) of a vector normal to the imaging plane (e.g., for THETA=0°, the imaging plane is the x-y plane, with the vector at the +z-axis; for THETA=90°, the imaging plane is the y-z, with PHI=0°; and for THETA=180°, the imaging plane is the x-y plane, with the vector at the −z-axis); and PHI is the polar angle (0°–360° within the x-y plane) of a vector normal to the imaging plane (e.g., PHI=0° is the +x-axis; and PHI=90° is the −y-axis).

A plurality of oblique imaging planes for purposes of a reference scan may be defined with a suitable resolution wherein:

D_THETA is the resolution of changes in THETA during calibration; and

D_PHI is the resolution of changes in PHI during calibration.

Figure 9A:
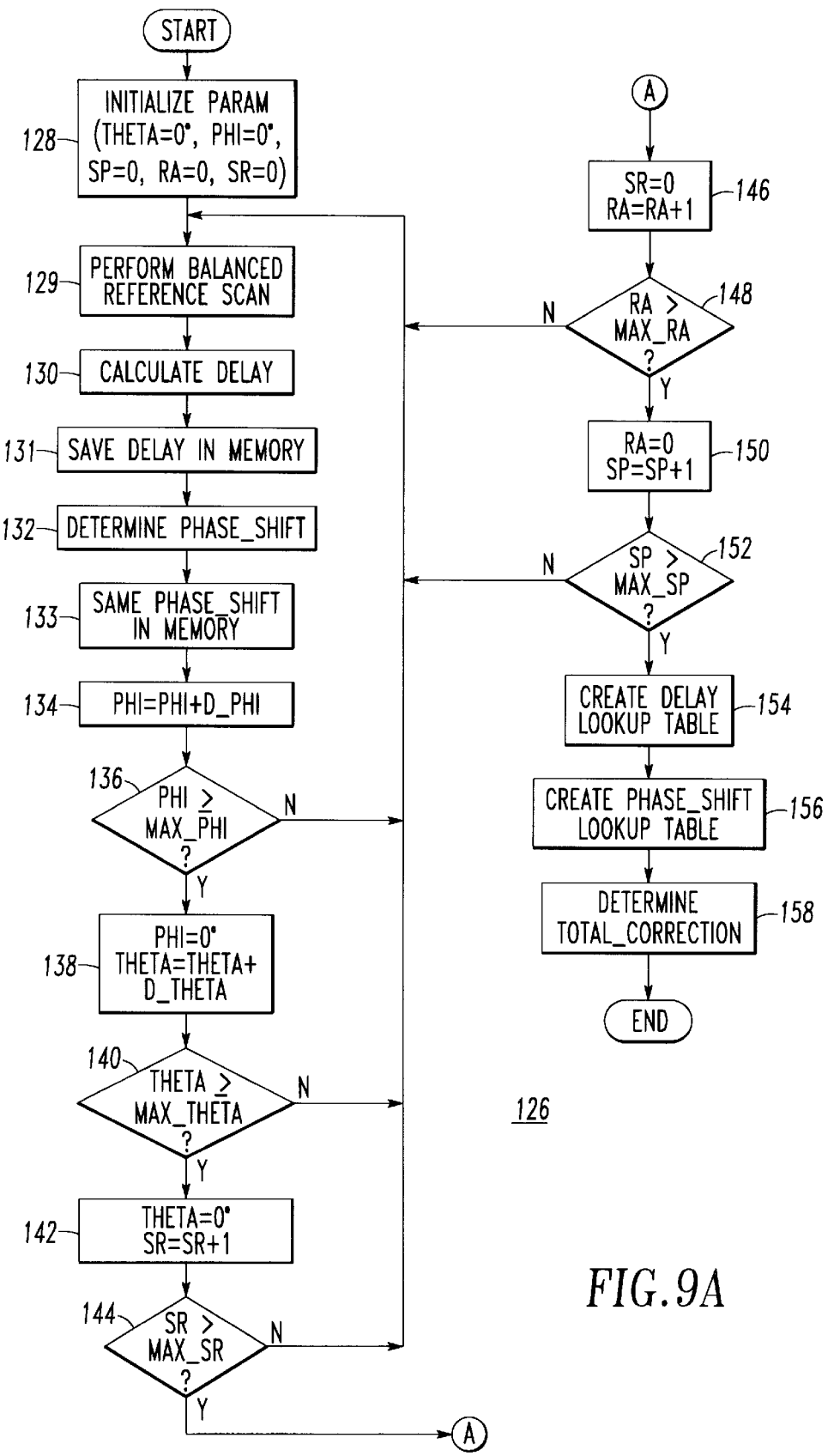
FIG. 9A is a flowchart of software executed by the computer of FIG. 2 to provide scanner calibration in accordance with the invention.

Referring to FIG. 9A, a scanner calibration routine 126 is illustrated which calibrates a scanner for time delays (DELAY) (e.g., $\delta k_r/\gamma G_r$, $\delta k_p/\gamma G_r$, $\delta k_s/\gamma G_r$) and additional phase corrections (PHASE_SHIFT) as a function of various parameters (PARAM) (for example, THETA; PHI; and other parameters, such as the normal distance from the imaging plane to the center of the gradient system, other relevant scanning parameters (e.g., sampling during gradient ramps), readout amplitude (i.e., $G_r$, the amplitude of the readout gradient), slew rate (SR) (i.e., the rate of change of $G_x,G_y,G_z$, e.g., SR=0=normal mode, SR=1=turbo mode)). At 128, the various parameters (PARAM) are set to initial values. As a non-limiting example, THETA=0°; PHI=0°; no sampling during gradient ramps (SP=0); readout amplitude=G0$_r$ (RA=0); and normal mode slew rate (SR=0). Then, at 129, employing the current parameters (PARAM), a balanced reference scan is performed as discussed above in connection with FIGS. 8A–8B, with two scans for each image plane angle (THETA,PHI). Next, at 130, the delay (DELAY) is calculated using a suitable method, such as linear regression as discussed above in connection with Equations 11–15. As employed herein, DELAY is the time difference between the $k_r$=0 position of the positive echo and the negative echo. At 131, the delay (DELAY) is saved in the memory (e.g., random access memory, disk 14) of the computer 12 of FIG. 2.

At 132, an additional phase correction (PHASE_SHIFT) is determined for the receiver filter (not shown) of the scanner. As the additional phase correction may be a constant or be non-linear, at 133, the additional phase correction (PHASE_SHIFT) is saved in the memory (e.g., random access memory, disk 14) of the computer 12 of FIG. 2.

Next, at 134, PHI is incremented by D_PHI, and, at 136, if PHI is less than MAX_PHI (e.g., 360°), then step 129 is repeated. Otherwise, if PHI is greater than or equal to MAX_PHI, then, at 138, PHI is reset to 0°, and THETA is incremented by D_THETA. Next, at 140, if THETA is less than MAX_THETA (e.g., 180°), then step 129 is repeated. Otherwise, if THETA is greater than or equal to MAX_THETA, then execution resumes at step 142. It will be appreciated that the foregoing execution of the two exemplary loops through 128–134,136,138,140 provides a plurality of balanced reference scans for a plurality of oblique imaging planes and, thus, provides a plurality of corresponding delays and phase shifts.

Additional loops are preferably provided for the other parameters. For example, at 142, THETA is reset to 0°, and SR is incremented as part of a third loop, and, at 144, if SR is less than or equal to MAX_SR (e.g., 1), then step 129 is repeated to conduct balanced reference scans for the exemplary turbo mode slew rate (SR=1). Otherwise, if SR is greater than MAX_SR, then, at 146, SR is reset to 0 (i.e., normal mode slew rate), and RA is incremented as part of a fourth loop.

In the fourth loop, at 148, if RA is less than or equal to MAX_RA, then step 129 is repeated to conduct balanced reference scans for the next readout amplitude=G1$_r$ (RA=1). Otherwise, if RA is greater than MAX_RA, then, at 150, RA is reset to 0 (i.e., readout amplitude=G0$_r$), and SP is incremented as part of a fifth loop.

In the fifth loop, at 152, if SP is less than or equal to MAX_SP, then step 129 is repeated to conduct balanced reference scans for the next relevant scanning parameter (e.g., sampling during gradient ramps for SP=1). Otherwise, if SP is greater than MAX_SP, then all five of the exemplary loops have been completed.

Then, at 154, a multi-dimensional look-up table for the delay, DELAY(THETA,PHI,SR,RA,SP,other parameters), is created for the various values of THETA, PHI, SR, RA, SP, and other relevant parameters by employing the plural delay values (DELAY(THETA,PHI,SR,RA,SP,other parameters)) as determined by the five loops, in a suitable interpolation routine, such as a standard B-spline.

At 156, and preferably in parallel to 154, a multi-dimensional look-up table for the additional phase correction, PHASE_SHIFT(THETA,PHI,SR,RA,SP,other parameters), is created for the various values of THETA, PHI, SR, RA, SP, and other relevant parameters, by employing the plural additional phase corrections (PHASE_SHIFT (THETA,PHI,SR,RA,SP,other parameters)) in a suitable interpolation routine, such as a standard B-spline. Although the exemplary embodiment employs look-up tables to provide relatively quick access to the delay values and additional phase corrections as a function of THETA, PHI, SR, RA, SP, and other relevant parameters, other storage or calculation methods may be employed (e.g., algorithms, functions) which define the delays and phase corrections with a suitable accuracy as a function of THETA and PHI and/or SR, RA, SP, and other relevant parameters.

Finally, at 158, a total correction output: TOTAL_CORRECTION(DELAY,PHASE_SHIFT) is determined from the look-up tables of steps 154 and 156.

Figure 9B:
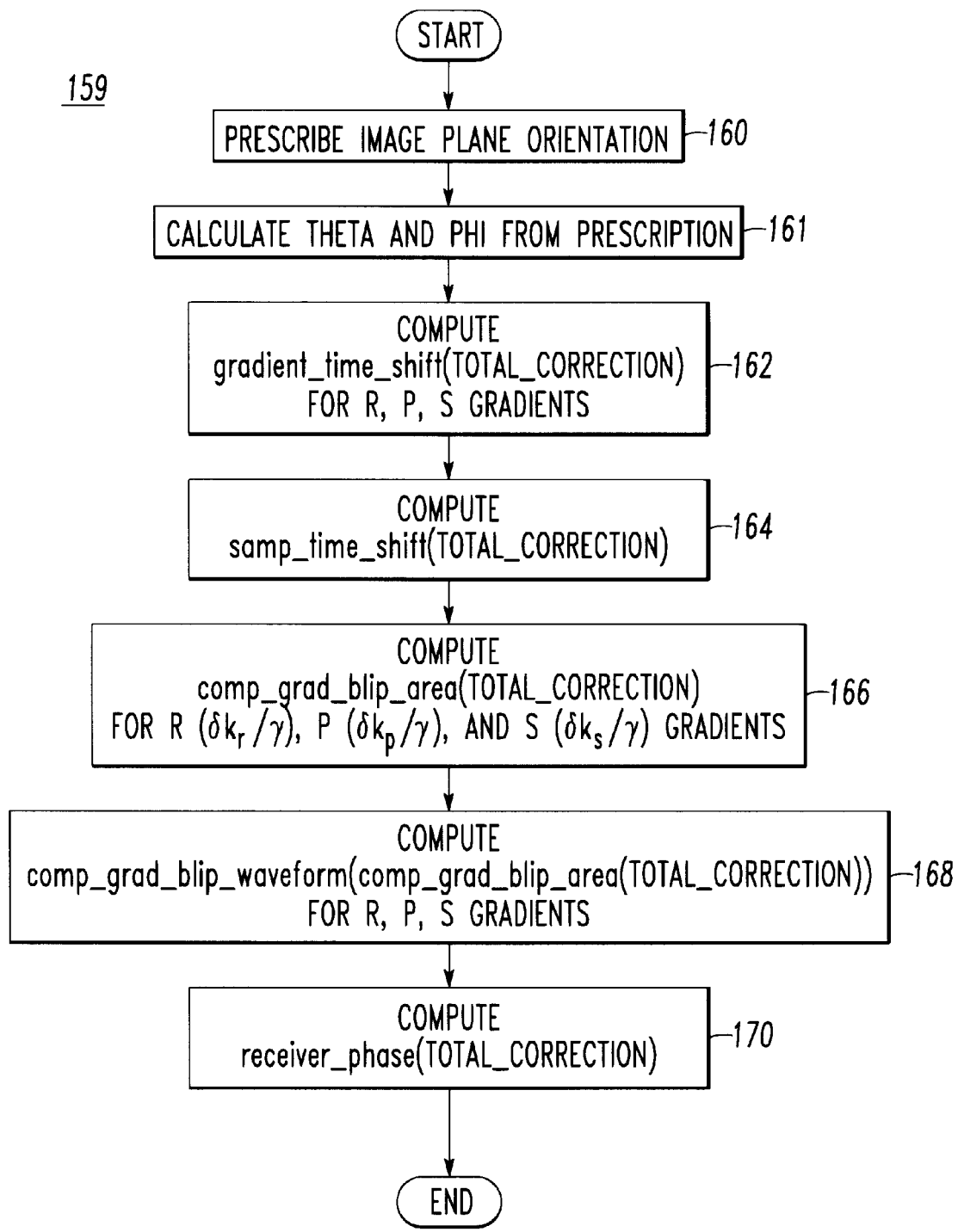
FIG. 9B is a flowchart of software executed by the computer of FIG. 2 to implement scanner correction by employing the scanner calibration of FIG. 9A in accordance with the invention.

Referring to FIG. 9B, a scanner correction routine 159 is illustrated which employs the output of the scanner calibration routine 126 of FIG. 9A. The routine 159 computes the actual gradient blip area for each TOTAL_CORRECTION (DELAY,PHASE_SHIFT). Also, the routine 159 computes the physical implementation of the correction by employing various combinations of three schemes: (1) gradient time shift (GTS); (2) conventional sampling comb time shift (SCTS), which provides correction to the nearest sampling interval; and (3) gradient blip application (GBA) as discussed above in connection with FIGS. 5C, 6C and 7C. As non-limiting examples, (a) only GBA (e.g., for small delays); (b) GTS and GBA; (c) SCTS and GBA; and (d) GTS, SCTS and GBA, may be employed. Finally, the routine 159 computes the additional phase shifts for receiver phase tuning. For purposes of illustration, the combination of GTS, SCTS and GBA is illustrated, although other combinations of the three schemes may be employed.

First, at 160, the image plane orientation is prescribed in terms of the vector normal to the prescribed image plane. Next, at 161, the values THETA and PHI are calculated from the prescription of 160. Also, the values for SR, RA, SP, and any other relevant parameters are determined based upon the current configuration of the scanner. Then, at 162, the gradient time shift: gradient_time_shift(TOTAL_CORRECTION(DELAY,PHASE_SHIFT)), is computed for the R, P and S gradients by employing the look-up tables of steps 154 and 156 of FIG. 9A. Alternatively, Equations 4, 7 and 8 may be employed.

Next, at 164, the sampling time shift: samp_time_shift (TOTAL_CORRECTION(DELAY,PHASE_SHIFT)), is computed by employing the look-up tables of steps 154 and 156 of FIG. 9A. Alternatively, Equations 4, 7 and 8 may be employed.

Then, at 166, the gradient blip area: comp_grad_blip_area(TOTAL_CORRECTION(DELAY,PHASE_SHIFT), is computed for the R ($\delta k_r/\gamma$), P($\delta k_p/\gamma$) and S($\delta k_s/\gamma$) gradients by employing the look-up tables of steps 154 and 156 of FIG. 9A. Alternatively, Equations 4, 7 and 8 may be employed.

Next, at 168, the gradient blip waveform: comp_grad_blip_waveform(comp_grad_blip_area(TOTAL_CORRECTION(DELAY, PHASE_SHIFT))), is computed for the R (see FIG. 6C), P (see FIG. 5C) and S (see FIG. 7C) gradients.

Then, at 170, which may be executed in parallel with respect to steps 162, 164, 166, and 168, as the computation of 170 does not depend upon the R, P and S gradients, the receiver phase: receiver_phase(TOTAL_CORRECTION (DELAY,PHASE_SHIFT)), for receiver phase tuning is calculated by employing the look-up tables of steps 154 and 156 of FIG. 9A. Alternatively, this value may be computed from a predetermined function or algorithm which provides: PHASE_SHIFT=f(THETA,PHI,SR,RA,SP,other parameters).

Figure 9C:
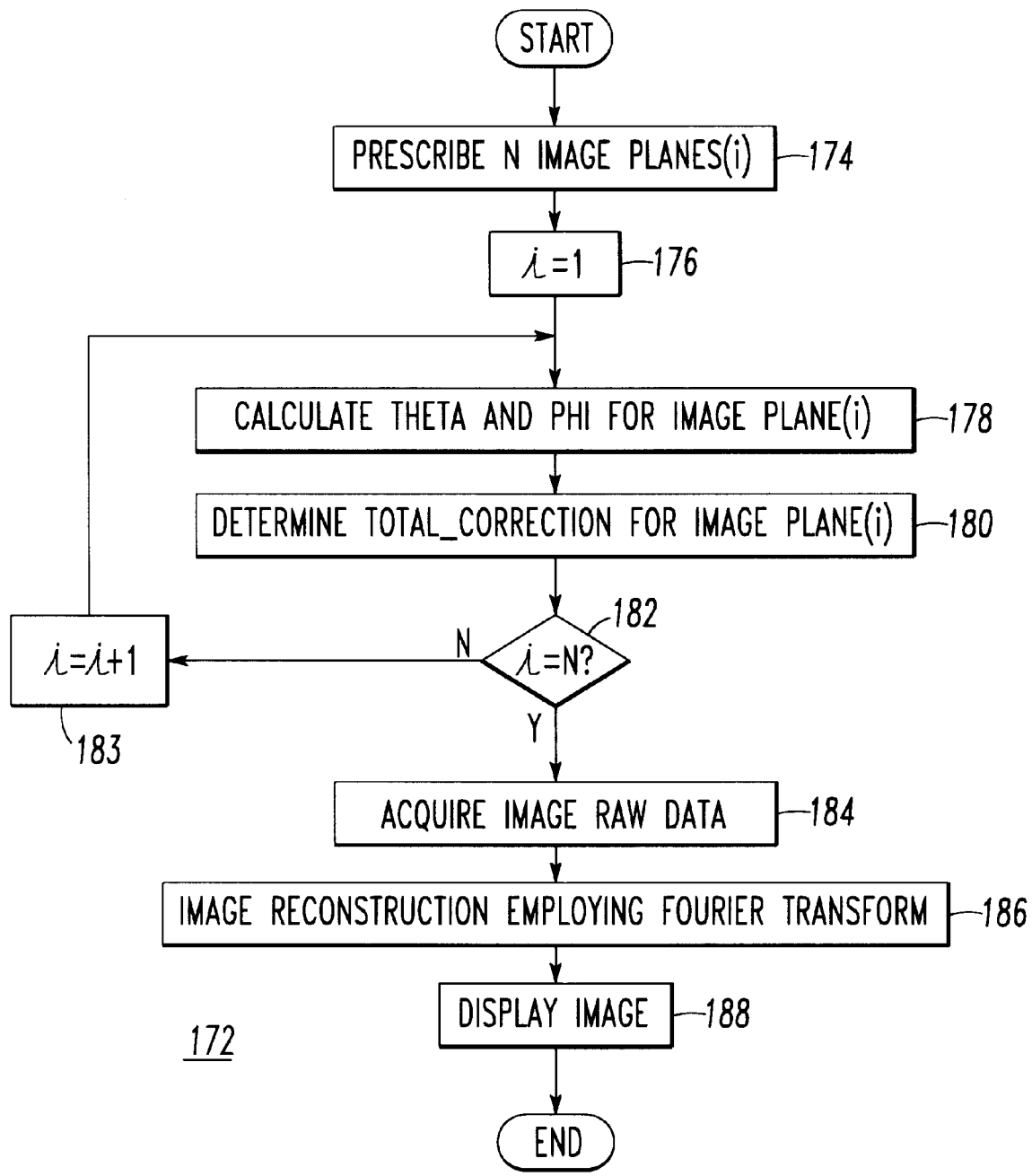
FIG. 9C is a flowchart of software executed by the computer of FIG. 2 to correct for system delays and phase offsets in accordance with the invention.

The exemplary scanner correction routine 159 of FIG. 9B is provided for a single imaging plane, although it will be appreciated that plural imaging planes may be prescribed. Referring to FIG. 9C, routine 172 corrects for system delays and phase offsets during an actual study or experiment. During image acquisition, involving one or more imaging planes, the image processing sub-system 46 of the computer 12 of FIG. 2 executes routine 172 in order to remove system time delays and constant phase offsets by modification of the pulse sequence. First, at 174, the image plane orientation of one or more imaging planes (e.g., a count of N imaging planes) is prescribed in terms of the vector normal to the prescribed image plane. At 176, a counter, i, is set to one. Next, at 178, the values THETA and PHI are calculated for imaging plane(i) from the prescription of 174. Then, at 180, the total correction (TOTAL_CORRECTION) is determined from steps 162,164,166,168,170 of FIG. 9B. A suitable combination of GTS, SCTS and GBA is employed as determined from steps 162, 164 and 168 of FIG. 9B to provide the appropriate correction. At 182, if the counter (i) is equal to the total number of imaging planes (A), then execution resumes at 184. Otherwise, at 183 the counter (i) is incremented before executing step 178 for the next imaging plane. Although changes to THETA and PHI result from the different imaging planes of step 174, the invention is applicable to still further changes in SR, RA, SP, and/or other relevant parameters, for the various imaging planes.

Next, for each of the imaging planes, at 184, the raw image data is acquired, followed by image reconstruction using Fourier transformation, at 186. Finally, at 188, the image is displayed.

For the other embodiment, in which calibration reference scans are employed on the orthogonal axes, the appropriate correction for imaging is determined in a different manner. First, the sampling comb and physical gradients are shifted in time to make corrections for filter delays and anisotropic gradient delays as shown in Equation 1. Next, the residual delays, $t_x$, $t_y$, and $t_z$, for each physical gradient, x, y, and z, respectively, and the rotation matrix R are used to calculate compensation blips for slice, readout and phase encoding gradients as shown in respective Equations 8, 4, and 7. For example, the areas, $-A_s$, $+2A_s$, $-2A_s$, of the first three slice compensation blips are determined from $A_s=\delta k_s/\gamma$, as shown in Equation 17.

$$A_s=\delta k_s/\gamma=(G_r)(R_{13}R_{11}t_x+R_{23}R_{21}t_y+R_{33}R_{31}t_z) \tag{17}$$

Then, the phase of the receiver 42 of FIG. 2 is suitably adjusted to compensate for constant phase offsets between positive and negative echoes. Finally, the compensated image is acquired and reconstructed without special post-processing corrections for delays. In this manner, the final result is an image free from ghosting artifacts caused by system time delays.

Imaging experiments may be performed on an exemplary GE Signa 1.5 T Horizon (version 5.5) scanner having shielded gradients with maximum gradient strength of $$2.2 \frac{G}{cm}$$

and slew rate of $$120 \frac{T/m}{s}$$

on all three axes. Compensation blips are added to a multi-echo spoiled gradient echo (SPGR) sequence. This sequence employs hardware optimized trapezoid (HOT) gradient waveforms to minimize dead period durations. See, E. Atalar et al., Minimization of dead-periods in MR pulse sequences for imaging oblique planes. The HOT algorithm minimizes TR and TE, and maximizes sequence efficiency for a given oblique orientation. Manufacturer interleaved EPI sequences may be employed to make scanner delay measurements.

Figure 10:
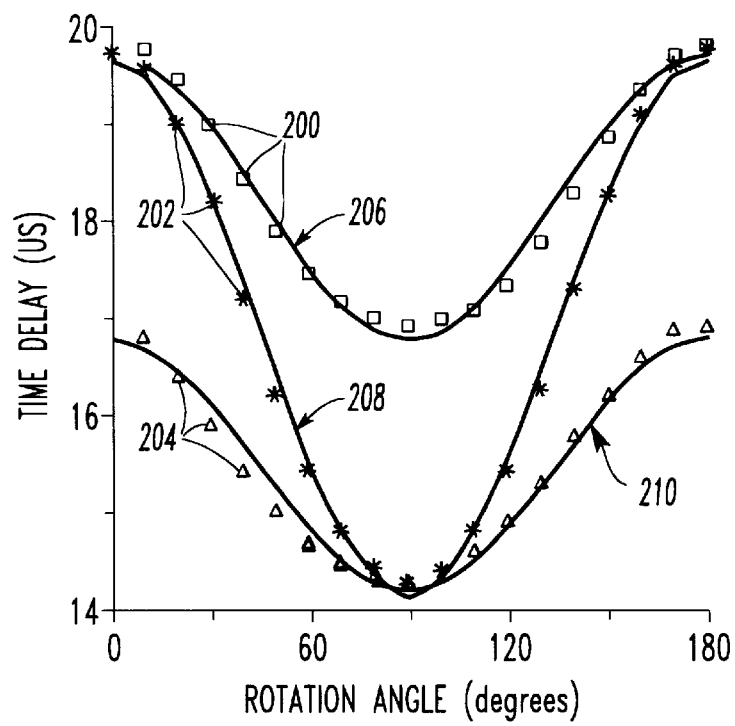
FIG. 10 is a plot of time delays measured for reference scans at different orientations, rotated in the x-y, x-z, and y-z planes.

FIG. 10 is an exemplary plot of the measured time delays 200, 202, and 204 in the x-y plane (curve 206), x-z plane (curve 208), and y-z plane (curve 210), respectively, against the rotation angle in that plane, using the orthogonal balanced reference scan technique. The symbols for the time delays 200, 202 and 204 represent measured data (as discussed above in connection with FIGS. 9A–9C), and the solid curves 206, 208 and 210 are plots of Equation 9, fit to determine the best estimate of $t_x$, $t_y$ and $t_z$, respectively. In the exemplary embodiment, these are equal to 19.7 $\mu$s, 16.8 $\mu$s and 14.2 $\mu$s, respectively. As shown by FIG. 10, Equation 9 accurately describes the behavior of the measured time delays (i.e., $t_x$, $t_y$, $t_z$), as the readout direction ($k_d$) is rotated obliquely.

In the example of FIG. 10, no corrections are made to remove bias caused by shifts in the phase encoding direction ($k_p$) on the time delay measurements in oblique orientations of FIG. 10. The strong orientation dependence of time delays with orientation is apparent even in the presence of any potential bias.

Figure 11:
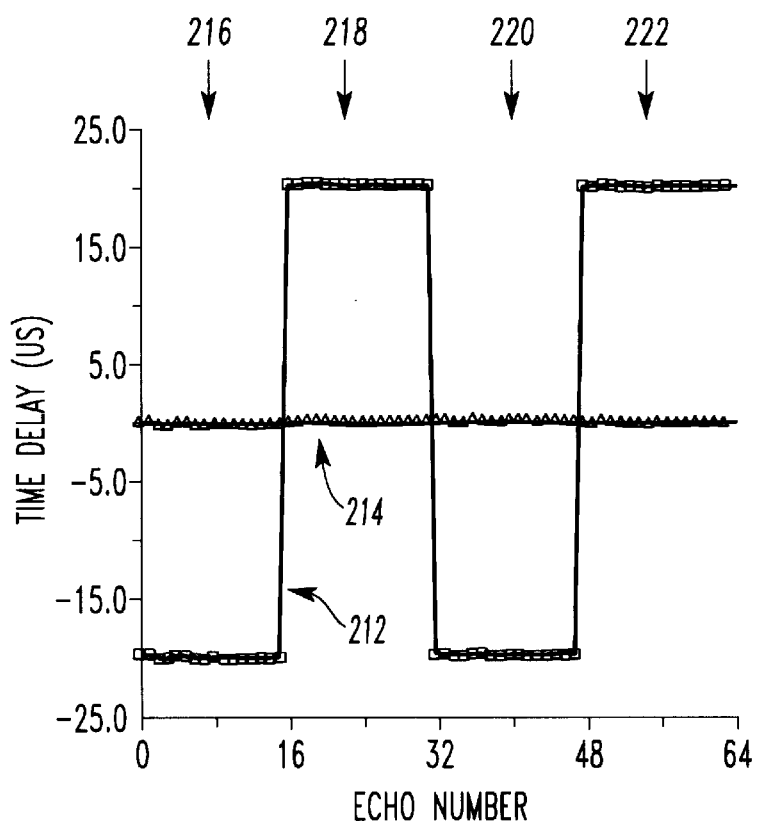
FIG. 11 is a plot of time delays (,us) versus phase encoding index for a four echo train length EPI data set before and after compensation blip correction.

Referring to FIG. 11, plots 212,214 of time delays measured from two raw data sets, before and after the readout compensation blips 74,76,78 of FIG. 6C were employed, to correct these delays for four groups of echoes 216,218,220, 222 of an EPI data set before (plot 212) and after (plot 214) compensation blip correction. Accurate compensation of these time delays is apparent from plot 214, thus, demonstrating the effectiveness of the compensation blips 74,76,78 in the readout direction ($k_r$).

Figure 12A:
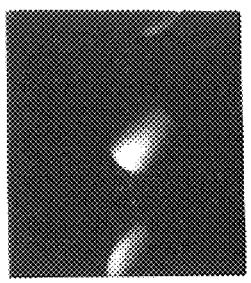
FIG. 12A is a representation of a single shot axial image of a water phantom, without compensation blips.
Figure 12B:
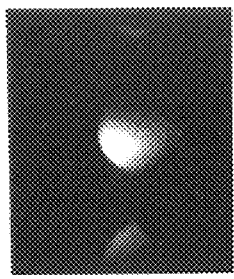
FIG. 12B is a representation of a single shot axial image of a water phantom, in which readout compensation blips were employed in the logical readout direction only.
Figure 12C:
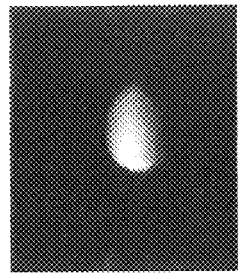
FIG. 12C is a representation of a single shot axial image of a water phantom, in which phase encoding compensation blips were employed.
Figure 12D:
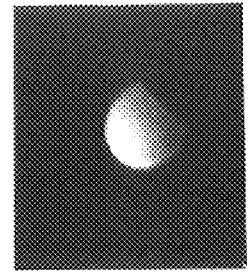
FIG. 12D is a representation of a single shot axial image of a water phantom, in which readout and phase encoding compensation blips were employed in both of the logical readout and phase encoding directions.

FIGS. 12A–12D show representations of single shot axial images of a water phantom, with and without compensation blips, after a 45° in-plane rotation. In FIG. 12A, no compensation was employed. In FIG. 12B, only the readout compensation blips 74,76,78 of FIG. 6C were employed. In FIG. 12C, only the phase encoding compensation blips 66,68,70 of FIG. 5C were employed. FIG. 12D has both and shows that compensation blips in both the readout direction ($k_r$) and phase encoding direction ($k_p$) are advantageous in eliminating ghosting artifacts, without resorting to any post-processing correction. For these exemplary representations, the imaging parameters include: 128×128 matrix, 90° flip angle, 32 cm FOV, 8 mm slice thickness, and ±64 kHz, with phase encoding being in the vertical direction.

Figure 13A:
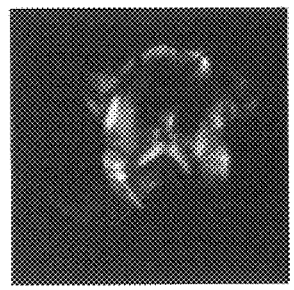
FIG. 13A is a representation of a two shot axial echo planar brain image acquired without compensation blips.
Figure 13B:
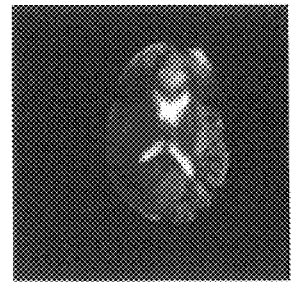
FIG. 13B is a representation of a two shot axial echo planar brain image acquired with compensation blips to correct for system time delays.

FIG. 13A shows a representation of a two shot echo planar brain image acquired without compensation blips. FIG. 13B shows a representation of a two shot echo planar brain image acquired with the compensation blips of FIGS. 5C, 6C and 7C to correct for system time delays. In this manner, the compensation blips have, thus, removed ghosting artifacts without any post-processing. For these exemplary representations, a chemical saturation pulse is employed to minimize artifacts from fat, and the imaging parameters include: 160×80 matrix, 90° flip angle, 28 cm FOV, and 8 mm slice thickness, with phase encoding being in the horizontal direction.

The exemplary apparatus and method correct time delays in echo planar imaging. Total system delays measured in oblique coordinates are dependent on image orientation. These delays may be easily predicted knowing the rotation matrix for that orientation and the delays of the three orthogonal directions. Individual reference measurements in the three orthogonal axes are performed, followed by appropriate rotation of the delays. Compensation blips are employed for time delay correction to remove the effects of anisotropic gradient delays and eliminate the need for repeated reference scans and post-processing corrections. The compensation blips are added to a pulse sequence to correct for the anisotropic gradient delays in oblique coordinates.

The exemplary calibration algorithm employs a balanced reference estimator to measure delays in the three orthogonal directions. Once a scanner has been calibrated for anisotropic time delays, compensation blips are an effective mechanism for removing these delays, without the need for post-processing corrections. This has important implications for real-time EPI applications that require rapid changes in scan plane positioning and should avoid repeated reference measurements and post-processing.

While for clarity of disclosure reference has been made herein to the exemplary display 50 for displaying an image, it will be appreciated that the image information may be stored, printed on hard copy, be computer modified, or be combined with other data. All such processing shall be deemed to fall within the terms "display" or "displaying" as employed herein.

Whereas particular embodiments of the present invention have been described above for purposes of illustration, it will be appreciated by those skilled in the art that numerous variations in the details may be made without departing from the invention as described in the appended claims.

We claim:

1. A method of magnetic resonance imaging comprising the steps of:

employing a magnetic resonance imaging apparatus having a plurality of gradient axes;

employing a plurality of imaging planes with respect to said gradient axes;

executing a plurality of gradient referencing pre-scans for said imaging planes to provide a plurality of calibration correction values for said imaging planes;

employing a specimen with respect to said gradient axes;

selecting an imaging plane with respect to the specimen;

establishing a main magnetic field with respect to the specimen;

applying radio frequency pulses to the specimen to produce magnetic resonance signals;

employing said calibration correction values for the selected imaging plane to adjust a plurality of gradient waveforms;

outputting said gradient waveforms as a plurality of magnetic field gradients with respect to said gradient axes;

acquiring magnetic resonance information from the magnetic resonance signals corresponding to the radio frequency pulses; and employing the magnetic resonance information and displaying an image of the specimen.

2. The method of claim 1 including storing a predetermined count of imaging planes in a look-up table;

employing said selected imaging plane with respect to said gradient axes different than said imaging planes in said look-up table; and interpolating said look-up table to provide said calibration correction values for the selected imaging plane.

3. The method of claim 1 including employing said imaging planes at an oblique angle with respect to one of said gradient axes.

4. The method of claim 1 including employing said imaging planes at an oblique angle with respect to a plurality of said gradient axes.

5. The method of claim 1 including employing said imaging planes at an oblique angle with respect to all of said gradient axes.

6. The method of claim 1 including employing said imaging planes orthogonal with respect to one of said gradient axes.

7. The method of claim 1 including employing said imaging planes orthogonal with respect to a plurality of said gradient axes.

8. The method of claim 1 including employing said imaging planes orthogonal with respect to all of said gradient axes.

9. The method of claim 8 including employing x, y and x-axes as said gradient axes;

employing for each of said gradient axes a positive readout gradient polarity waveform and a negative readout gradient polarity waveform;

acquiring echo trains for each of said positive and negative readout gradient polarity waveforms;

Fourier transforming each echo of said echo trains; and estimating time delays of said gradient waveforms as said calibration correction values.

10. The method of claim 1 including employing readout, phase encoding and slice gradients as logical gradient waveforms;

converting said logical gradient waveforms to physical gradient waveforms; and outputting said physical gradient waveforms as said magnetic field gradients.

11. The method of claim 10 including adjusting two of said logical gradient waveforms.

12. The method of claim 10 including adjusting all of said logical gradient waveforms.

13. The method of claim 10 including adjusting said readout gradient as one of said logical gradient waveforms.

14. The method of claim 10 including adjusting said slice gradient as one of said logical gradient waveforms.

15. The method of claim 11 including adjusting said readout gradient and said slice gradient as said two of said logical gradient waveforms.

16. The method of claim 13 including employing a plurality of positive and negative pulses as said readout gradient.

17. The method of claim 13 including adjusting an area of a first positive pulse of said readout gradient by negative one times a constant;

adjusting an area of a first negative pulse of said readout gradient by two times said constant; and adjusting an area of a second positive pulse of said readout gradient by negative two times said constant.

18. The method of claim 17 including employing $\delta k_r/\gamma$ as said constant, wherein $\delta k_r$ is shift in readout direction, and $\gamma$ is the nucleus gyromagnetic ratio;

adjusting an area of subsequent negative pulses of said readout gradient by two times said constant; and adjusting an area of subsequent positive pulses of said readout gradient by negative two times said constant.

19. The method of claim 14 including adjusting an area of a first positive pulse of said slice gradient by negative one times a constant;

adjusting an area of a first negative pulse of said slice gradient by two times said constant; and adjusting an area of a second positive pulse of said slice gradient by negative two times said constant.

20. The method of claim 19 including employing $\delta k_s/\gamma$ as said constant, wherein $\delta k_s$ is shift in slice direction, and $\gamma$ is the nucleus gyromagnetic ratio;

adjusting an area of subsequent negative pulses of said slice gradient by two times said constant; and adjusting an area of subsequent positive pulses of said slice gradient by negative two times said constant.

21. The method of claim 10 including adjusting said phase encoding gradient as one of said logical gradient waveforms.

22. The method of claim 21 including employing a plurality of blips as said phase encoding gradient.

23. The method of claim 22 including adjusting an area of a first blip of said phase encoding gradient by negative one times a constant;

adjusting an area of a second blip of said phase encoding gradient by two times said constant; and adjusting an area of a third blip of said phase encoding gradient by negative two times said constant.

24. The method of claim 23 including employing $\delta k_p/\gamma$ as said constant, wherein $\delta k_p$ is shift in phase encoding direction, and $\gamma$ is the nucleus gyromagnetic ratio;

adjusting an area of subsequent even blips of said phase encoding gradient by two times said constant; and adjusting an area of subsequent odd blips of said phase encoding gradient by negative two times said constant.

25. The method of claim 1 including employing said magnetic field gradients in an echo planar imaging scan to image the specimen.

26. The method of claim 1 including employing said magnetic field gradients to generate a real-time image of the specimen.

27. The method of claim 10 including defining a 3×3 rotation matrix, R, as a function of said selected imaging plane and said gradient axes;

inputting $t_x$, $t_y$, and $t_z$ as said calibration correction values from a calibration table for the selected imaging plane; and calculating an adjustment, $-\delta k_r/\gamma$, for an area of a first positive pulse of said readout gradient from:

$$-\delta k_r/\gamma = -G_r(R_{11}^2 t_x + R_{21}^2 t_y + R_{31}^2 t_z)$$

wherein:

$G_r$ is amplitude of the readout gradient, said rotation matrix maps said logical gradient waveforms to physical coordinates, $R_{i1}$ is an element of the $i^{th}$ row and the first column of said rotation matrix, and i=1, 2 or 3.

28. The method of claim 10 including defining a 3×3 rotation matrix, R, as a function of said selected imaging plane and said gradient axes;

employing $t_x$, $t_y$, and $t_z$ as said calibration correction values for the selected imaging plane; and calculating an adjustment constant, $-\delta k_s/\gamma$, for an area of a first positive pulse of said slice gradient from:

$$-\delta k_s/\gamma = -G_r(R_{13}R_{11}t_x + R_{23}R_{21}t_y + R_{33}R_{31}t_z)$$

wherein:

$G_r$ is the amplitude of the readout gradient, said rotation matrix maps said logical gradient waveforms to physical coordinates, $R_{ij}$ is a matrix element of the $i^{th}$ row and the $j^{th}$ column of said rotation matrix, i=1, 2 or 3, and j=1, or 3.

29. The method of claim 10 including defining a 3×3 rotation matrix, R, as a function of said selected imaging plane and said gradient axes;

employing $t_x$, $t_y$, and $t_z$ as said calibration correction values for the selected imaging plane; and calculating an adjustment constant, $-\delta k_p/\gamma$, for an area of a first positive pulse of said phase encoding gradient from:

$$-\delta k_p/\gamma = -G_r(R_{12}R_{11}t_x + R_{22}R_{21}t_y + R_{32}R_{31}t_z)$$

wherein:

$G_r$ is the amplitude of the readout gradient, said rotation matrix maps said logical gradient waveforms to physical coordinates, $R_{ij}$ is an element of the $i^{th}$ row and the $j^{th}$ column of said rotation matrix, i=1, 2 or 3, and j=1, or 2.

30. The method of claim 1 including employing at least some of said imaging planes which are oblique with respect to said gradient axes.

31. The method of claim 1 including employing three imaging planes which are orthogonal with respect to said gradient axes.

32. The method of claim 1 including storing said calibration correction values in a look-up table.

33. The method of claim 32 including employing an azimuthal angle of a vector normal to said selected imaging plane;

employing a polar angle of said vector; and accessing said calibration correction values in said look-up table with said angles.

34. The method of claim 32 including storing empirical data for said calibration correction values in said look-up table.

35. The method of claim 1 including storing said calibration correction values in an equation.

36. The method of claim 1 including employing time delays and phase corrections as said calibration correction values.

37. The method of claim 36 including storing said time delays with respect to said imaging planes.

38. The method of claim 37 including storing said time delays in a plural-dimensional look-up table as a function of two angles of said selected imaging plane.

39. The method of claim 38 including storing said time delays in said plural-dimensional look-up table also as a function of at least one of a scanning parameter, a readout amplitude, and a readout amplitude slew rate.

40. The method of claim 36 including storing said phase corrections in a plural-dimensional look-up table as a function of two angles of said selected imaging plane and at least one of a scanning parameter, a readout amplitude, and a readout amplitude slew rate.

41. The method of claim 36 including employing a total correction output as a function of said time delays and said phase corrections.

42. The method of claim 13 including employing a first positive pulse or blip of one of said gradients;

adjusting an area of a first negative pulse or blip of said one of said gradients by two times a constant; and adjusting an area of a second positive pulse or blip of said one of said gradients by negative two times said constant.

43. The method of claim 1 including receiving said magnetic resonance signals and outputting said magnetic resonance information with a shift in phase; and employing said calibration correction values for the selected imaging plane to adjust said shift in phase.

44. A method of calibrating a magnetic resonance imaging apparatus having a plurality of gradient axes comprising the steps of:

employing a plurality of imaging planes with respect to said gradient axes;

employing at least some of said imaging planes at oblique angles with respect to said gradient axes;

executing a plurality of gradient referencing pre-scans for said imaging planes to provide a plurality of calibration correction values for said imaging planes; and storing said calibration correction values for said imaging planes to calibrate said magnetic resonance imaging apparatus.

45. The method of claim 44 including employing some of said imaging planes orthogonal with respect to said gradient axes.

46. The method of claim 45 including executing a plurality of gradient referencing pre-scans for said imaging planes orthogonal with respect to said gradient axes to provide a plurality of initial calibration correction values; and executing a plurality of gradient referencing pre-scans employing said initial calibration correction values for said imaging planes at oblique angles with respect to said gradient axes to provide said calibration correction values for said imaging planes.

47. A magnetic resonance imaging apparatus for imaging a specimen comprising:

means for establishing a main magnetic field with respect to the specimen;

means for applying radio frequency pulses to the specimen to produce corresponding magnetic resonance signals;

means for applying a plurality of gradient waveforms to the specimen;

means for defining or storing a plurality of calibration correction values for each of a plurality of different imaging planes;

means for selecting an imaging plane with respect to the specimen;

means employing said calibration correction values for the selected imaging plane for adjusting at least some of said gradient waveforms;

means for acquiring magnetic resonance information from the magnetic resonance signals corresponding to the radio frequency pulses; and means employing the magnetic resonance information for displaying an image of the specimen.

48. The apparatus of claim 47 including said means for applying includes means for applying a plurality of physical gradient waveforms to the specimen; and said means employing said calibration correction values includes means for adjusting logical gradient waveforms with said calibration correction values for the selected imaging plane and means for converting said logical gradient waveforms to said physical gradient waveforms.

49. The apparatus of claim 47 including said means employing said calibration correction values includes means for applying gradient blips to adjust said gradient waveforms for the selected imaging plane.

50. The apparatus of claim 49 including said means employing said calibration correction values further includes means employing at least one of: gradient time shift, and sampling comb time shift in combination with said means for applying gradient blips to adjust said gradient waveforms for the selected imaging plane.

51. The apparatus of claim 49 including said means employing said calibration correction values includes means for adjusting all of said gradient waveforms.

52. The apparatus of claim 47 including said means for acquiring magnetic resonance information includes a receiver for said magnetic resonance signals, said receiver outputs said magnetic resonance information with a shift in phase; and said means employing said calibration correction values includes means for adjusting said shift in phase of said receiver.

* * * * *

UNITED STATES PATENT AND TRADEMARK OFFICE
CERTIFICATE OF CORRECTION

PATENT NO. : 6,188,219 B1
DATED : February 13, 2001
INVENTOR(S) : Scott B. Reeder et al.

It is certified that error appears in the above-identified patent and that said Letters Patent is hereby corrected as shown below:

Column 1,
Line 50, italicize "Magnetic Resonance Quarterly".
Line 62, add a space between "pp." and "259-64".

Column 6,
Line 30, "(,us)" should read -- ($\mu$s) --.

Column 11,
Equation 4, after "$\gamma G_r$" the equation should read -- $(R^2_{11}t_x + R^2_{21}t_y + R^2_{31}t_z)$ --.
Equation 5, after "$\gamma G_r$" the equation should read -- $(R^2_{11} + R^2_{21} + R^2_{31})t_x + \pm$ "$\gamma G_r t_x$ --.

Column 20,
Line 31, "(A)" should read -- ($N$) --.

Signed and Sealed this

Fourth Day of March, 2003

JAMES E. ROGAN
*Director of the United States Patent and Trademark Office*